(12) United States Patent
Finn

(10) Patent No.: US 11,044,123 B2
(45) Date of Patent: Jun. 22, 2021

(54) AUTO-ZERO RECEIVER WITH INTEGRATED DFE, VGA AND EYE MONITOR

(71) Applicant: Renesas Electronics America Inc., Milpitas, CA (US)

(72) Inventor: Steven Ernest Finn, Chamblee, GA (US)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

(21) Appl. No.: 17/002,517

(22) Filed: Aug. 25, 2020

(65) Prior Publication Data

US 2021/0067385 A1 Mar. 4, 2021

Related U.S. Application Data

(60) Provisional application No. 62/894,302, filed on Aug. 30, 2019.

(51) Int. Cl.
*H04L 25/03* (2006.01)
*G11C 7/10* (2006.01)

(52) U.S. Cl.
CPC ...... *H04L 25/03057* (2013.01); *G11C 7/1084* (2013.01); *H04L 2025/03535* (2013.01)

(58) Field of Classification Search
CPC .......... G11C 2207/2254; G11C 7/1066; G11C 7/1084; H03D 3/008; H04L 25/069; H04L 25/03885; H04L 25/03057; H04L 2025/03535
USPC ......................................................... 375/233
See application file for complete search history.

(56) References Cited

U.S. PATENT DOCUMENTS

2019/0296691 A1* 9/2019 Finn ...................... H04L 25/069

* cited by examiner

*Primary Examiner* — Leila Malek
(74) *Attorney, Agent, or Firm* — Christopher P. Maiorana, PC

(57) ABSTRACT

An apparatus includes a first half-cell, a second half-cell, a multiplexer and a decision feedback equalizer. The first input stage may be configured to present a first differential input to the first auto-zero stage and the second auto-zero stage. The second input stage may be configured to present a second differential input to the third auto-zero stage and the fourth auto-zero stage. The multiplexer may be configured to receive a first output from the first auto-zero stage, receive a second output from the third auto-zero stage and present a decision feedback input comprising one of the first output and the second output. The decision feedback equalizer may be configured to generate a feedback signal in response to the decision feedback input and present the feedback signal to the first feedback buffer and the second feedback buffer.

20 Claims, 10 Drawing Sheets

AUTO-ZERO RECEIVER WITH INTEGRATED DFE, VGA AND EYE MONITOR

This application relates to U.S. Provisional Application No. 62/894,302, filed Aug. 30, 2019, which is hereby incorporated by reference in its entirety.

FIELD OF THE INVENTION

The invention relates to memory interfaces generally and, more particularly, to a method and/or apparatus for implementing an auto-zero receiver with integrated DFE, VGA, and eye monitor.

BACKGROUND

Power consumption is an important metric in conventional double data rate memory modules. A significant portion of the device power is utilized in the receivers. Power consumption for the memory data-path receivers needs to be significantly reduced. Low power consumption is important for portable devices (i.e., laptop computers, netbook computers, smartphones, etc.) for long battery life. Low power consumption is also preferred in desktop and/or server computers even if a power source is readily available (i.e., reduced carbon footprint, lower energy bills, less heat generation, etc.). However, while low power consumption is beneficial, end-users generally do not want to sacrifice performance.

Generally, power consumption is fundamentally limited by wide input common mode, low-mismatch, low-noise, and high-bandwidth requirements. Additional power savings can be achieved by receiver circuitry supporting fast idle-to-active transitions (i.e., less than 1ns). Fast idle-to-active transitions enable power-down of the receiver circuitry for lowering idle power consumption. Auto-zero receiver technology simultaneously provides rail-to-rail input common mode range, input linearity, low mismatch, and low power. However, improvements in both power consumption and performance are still needed.

It would be desirable to implement an auto-zero receiver with integrated DFE, VGA, and eye monitor.

SUMMARY

The invention concerns an apparatus including a first half-cell, a second half-cell, a multiplexer and a decision feedback equalizer. The first half-cell may comprise a first input stage, a first auto-zero stage, a second auto-zero stage and a first feedback buffer. The first input stage may be configured to present a first differential input to the first auto-zero stage and the second auto-zero stage. The second half-cell may comprise a second input stage, a third auto-zero stage, a fourth auto-zero stage and a second feedback buffer. The second input stage may be configured to present a second differential input to the third auto-zero stage and the fourth auto-zero stage. The multiplexer may be configured to receive a first output from the first auto-zero stage, receive a second output from the third auto-zero stage and present a decision feedback input comprising one of the first output and the second output. The decision feedback equalizer may be configured to generate a feedback signal in response to the decision feedback input and present the feedback signal to the first feedback buffer and the second feedback buffer.

The first output may be generated in response to the first differential input and the feedback signal. The second output may be generated in response to the second differential input and the feedback signal.

BRIEF DESCRIPTION OF THE FIGURES

Embodiments of the invention will be apparent from the following detailed description and the appended claims and drawings.

DETAILED DESCRIPTION OF THE EMBODIMENTS

Figure 1:
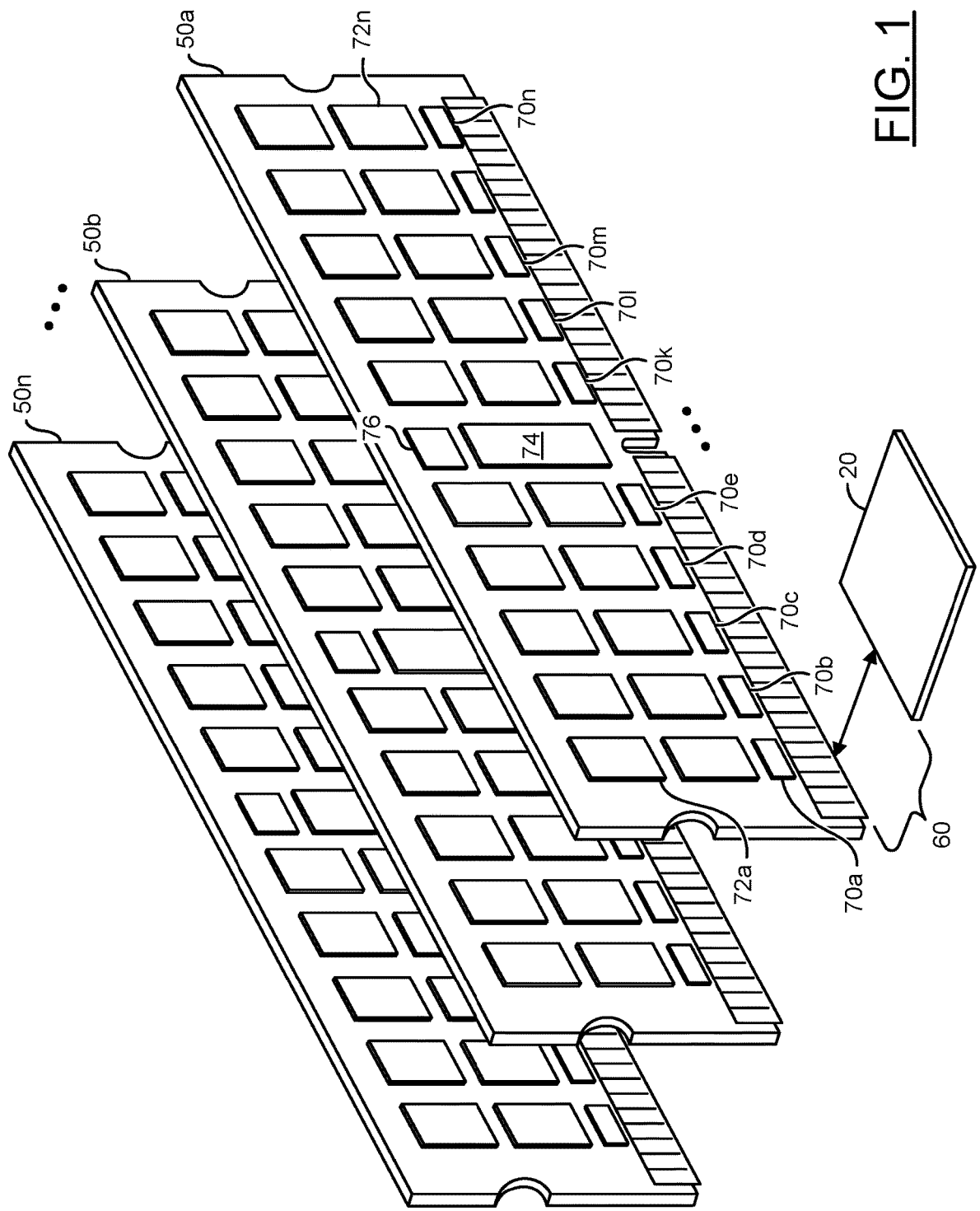
FIG. 1 is a diagram illustrating an example embodiment of a memory system in accordance with an example embodiment of the invention.

Embodiments of the present invention include providing an auto-zero receiver with integrated DFE, VGA, and eye monitor that may (i) prevent a mismatch between data signals and clock signals, (ii) reduce power consumption, (iii) provide capacitive coupling, (iv) provide a rail-to-rail common-mode input range, (v) receive data signals in a memory interface, (vi) receive differential signals in a memory interface, (vii) be compliant with the DDR5 JEDEC specification, (viii) provide a wide common mode range, (ix) implement a precise DFE step size and eye-monitor step size and/or (x) be implemented as one or more integrated circuits.

Embodiments of the present invention may comprise auto-zero receiver technology. The auto-zero receiver may be combined with an integrated decision feedback equalizer (DFE), a variable gain amplifier (VGA) and an eye-monitor (EM). The receiver may be configured to simultaneously provide rail-to-rail input common mode range, input linearity, low mismatch, all while consuming low power.

The receiver may be configured to be compliant (e.g., JEDEC compliant) with a double data rate fifth generation (DDR5) memory. Embodiments of the present invention may be configured to operate as a receiver with speeds (e.g., data throughput) ranging from 260 Mbps to 5 Gbps. The receiver may implement a precise DFE step size, a precise eye-monitor step size, a wide common mode range, consume low power, and provide high bandwidth (e.g., greater than 5 Gbps).

A single-ended, passive, capacitively coupled summation node may be implemented. At the summation node, an input signal transfer function may be dependent on a variable capacitance value to achieve the functionality of a VGA. A DFE feedback transfer function may be combined with the signal path by additional capacitors connected to the summation node. The DFE amplitude may be controlled based on a number of DFE feedback capacitors being driven by a feedback buffer.

Auto-zero amplifiers may operate as a pre-amplifier to increase an amplitude of a signal observed at the summation node. The eye monitor may be implemented by using an additional auto-zero pre-amplifier with an independent reference voltage. The independent reference voltage for the eye-monitor may be used to set a common-mode of the primary signal path during an eye-monitor mode calibration phase.

Two signal paths may be implemented (e.g., a main signal path and an eye-monitor signal path). Both the main signal path and the eye-monitor signal path may implement pre-amplifiers configured to drive a clocked comparator configured to slice the signal. Sliced signals may be fed into a DFE feedback first-in-first-out (FIFO) buffer to store prior samples. The prior samples may operate as the DFE feedback information. DFE feedback polarity may be set by muxing between negative or positive outputs of a differential clocked comparator.

The eye-monitor path may be implemented having an independent DFE summation node from the main signal path. The independent DFE summation may be implemented to allow for independent common-modes (e.g., as per a requirement of eye-monitor functionality). An independent regulator may be used to make an amplitude voltage of the DFE feedback and a temperature independent. A common-mode of the eye-monitor may be set to half of the rail-to-rail level plus/minus an offset. The offset may be determined by a gain of the VGA.

Embodiments of the invention may implement low power data path receivers. Embodiments of the present invention may implement an auto-zero receiver comprising a decision feedback equalizer, a variable gain amplifier and an eye monitor. The decision feedback equalizer, the variable gain amplifier and the eye monitor may be integrated with the auto-zero receiver. The auto-zero receiver may have a rail-to-rail input. The receiver may have nearly perfect input linearity. In one example, the receiver may be implemented in a data buffer circuit for a DDR5 memory module. In another example, the receiver may be implemented in a registered clock driver (RCD) circuit for a DDR5 memory module. In an example, power consumption in the data path may be reduced approximately 4 to 5 times for similar bandwidth compared to current-mode logic (CML) implementations. The receiver may be further configured to extend an input common-mode range and/or reduce mismatch between clock and data to a point where trim is no longer necessary.

The receiver may implement an auto-zeroing technique. The auto-zeroing technique may be used to reduce an effect of mismatch and/or low-frequency noise. In one example, reducing the effect of mismatch and/or low-frequency noise (e.g., compared to an analog and/or CML approach) may facilitate implementations of smaller device sizes. In another example, lower current may be drawn in order to achieve similar bandwidth and/or performance metrics (e.g., compared to higher power consuming implementations that do not implement the auto-zeroing technique such as charge steering and/or charge summing topologies).

The auto-zeroing technique may be implemented using circuitry comprising capacitive coupling. The capacitive coupling nature of auto-zeroing circuitry may be configured to simultaneously incorporate the DFE, VGA and/or EM functions into a single summation node. A rail-to-rail common-mode input range may be achieved by the same capacitive coupling.

The auto-zeroing technique may be configured to tune idle-to-active timing and/or idle-power. In an example, idle-to-active timing may be tuned to enable fast transitions (e.g., fast idle-to-active transitions enable receiver circuitry to power-down, which lowers idle power). Idle-to-active timing and/or idle-power may be tuned by leaving one auto-zero half-cell in a calibration phase during an idle mode of operation.

Referring to FIG. 1, a diagram illustrating an example embodiment of a memory system in accordance with an example embodiment of the invention is shown. In various embodiments, the memory system includes a number of circuits 50a-50n. The circuits 50a-50n may be implemented as memory modules (or boards). In an example, the circuits 50a-50n may be implemented as dual in-line memory modules (DIMMs). In some embodiments, the circuits 50a-50n may be implemented as double data rate fifth generation (DDR5) SDRAM modules. In the example shown, the circuits 50a-50n may be illustrated as buffered DDR5 memory modules. In some embodiments, the circuits 50a-50n may be unbuffered DDR5 memory modules.

In various embodiments, the circuits 50a-50n may comprise a number of blocks (or circuits) 70a-70n, a number of blocks (or circuits) 72a-72n, a block (or circuit) 74, a block (or circuit) 76 and/or various other blocks, circuits, pins, connectors and/or traces. The circuits 70a-70n may be configured as data buffers. The circuits 72a-72n may implement memory devices. In an example, the circuits 72a-72n may be implemented as synchronous dynamic random-access memory (SDRAM) devices (or chips, or modules). The circuit 74 may be implemented as a registered clock driver (RCD). In an example, the RCD circuit 74 may be implemented as a RCD circuit compliant with the JEDEC specification (e.g., DDR5 standard). For example, in embodiments implementing the circuits 50a-50n as DDR5 compliant SDRAM modules, the memory modules 50a-50n may comprise the circuits 72a-72n arranged in rows of ten SDRAM devices (or chips, or modules), the circuits 70a-70n arranged in a row corresponding with the circuits 72a-72n, the RCD circuit 74 located so that the circuits 72a-72n are in groups of five on either of two sides of the RCD circuit 74, and a power management integrated circuit (PMIC) compliant with the JEDEC DDR5 specification. The circuit 76 may be implemented as a power management integrated circuit (PMIC). The type, arrangement and/or number of components of the memory modules 50a-50n may be varied to meet the design criteria of a particular implementation.

The memory modules 50a-50n are shown connected to a block (or circuit) 20. The circuit 20 may implement a memory controller (e.g., a host controller). The circuit 20 may be located in another device, such as a computing engine. Various connectors (or pins or traces) 60 may be implemented to connect the memory modules 50a-50n to the memory controller 20. In some embodiments, the connectors (or pins or traces) 60 may be a 288-pin configuration. In an example, the memory controller 20 may be a component of a computer motherboard (or main board). In another example, the memory controller 20 may be a component of a microprocessor. In yet another example, the memory controller 20 may be a component of a central processing unit (CPU).

In an example, some of the connectors (or pins or traces) 60 may be part of the memory modules 50a-50n and some of the connectors (or pins or traces) 60 may be part of the motherboard and/or memory controller 20. The memory modules 50a-50n may be connected to the computer motherboard (e.g., by pins, traces and/or connectors 60) to transfer data between components of a computing device and the memory modules 50a-50n. In some embodiments, the connectors/pins/traces 60 may implement an 80-bit bus. In some embodiments implementing UDIMM, the connectors (or pins or traces) 60 may implement a 64-bit bus or a 72-bit bus. In an example, the memory controller 20 may be implemented on a northbridge of the motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the circuits 50a-50n may be implemented as DDR5 SDRAM memory modules. In an example, the circuits 50a-50n may have a memory module density of 128 gigabyte (GB), 512 GB, one terabyte (TB), or higher per module. In embodiments implementing DDR5 compliant SDRAM memory modules, the circuits 50a-50n may operate with a frequency of 1.2-3.2 giga-Hertz (GHz) and/or higher frequencies.

In embodiments implementing DDR5 standard SDRAM memory modules, the circuits 50a-50n may have a data rate range from 3.2 GT/s to 4.6 GT/s. In an example embodiment implementing DDR5 SDRAM memory modules, the circuits 50a-50n may operate at up to 8 GT/s. In an example embodiment implementing DDR5 SDRAM memory modules, the circuits 50a-50n may operate at a voltage of approximately 1.1V. The operating parameters of the memory modules 50a-50n may be varied according to the design criteria of a particular implementation.

The memory modules 50a-50n may be implemented according to a fifth generation (DDR5) standard. References to the DDR5 standard may refer the DDR5 specification published and/or distributed to committee members by JEDEC on Jul. 14, 2020. Appropriate sections of the DDR5 standard are hereby incorporated by reference in their entirety. The JEDEC specification may refer to the DDR5 SDRAM specification and/or specifications for future generations of DDR SDRAM (e.g., DDR6).

Figure 2:
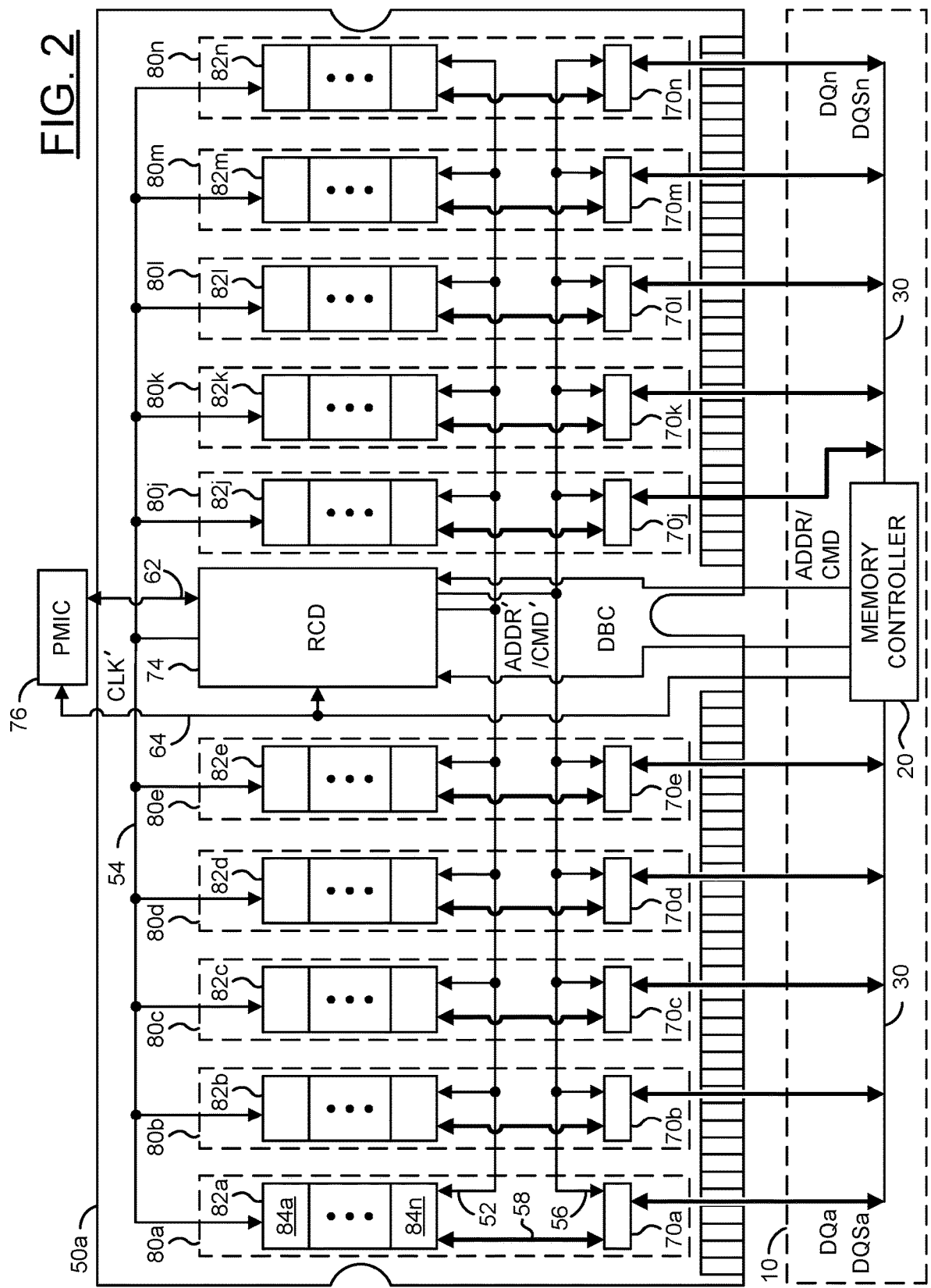
FIG. 2 is a block diagram illustrating a memory module in accordance with an example embodiment of the invention.

Referring to FIG. 2, a block diagram illustrating a memory module in accordance with an example embodiment of the invention is shown. The memory module 50a may be representative of the memory modules 50a-50n shown in association with FIG. 1. The memory module 50a is shown communicating with the memory controller 20. The memory controller 20 is shown as part of a block (or circuit) 10. The circuit 10 may be a motherboard (or main board), or other electronic component or computing engine or host device that communicates with the memory module 50a.

The memory module 50a may comprise one or more blocks (or circuits) 80a-80n, the RCD circuit 74 and/or the PMIC 76. The circuits 80a-80n may implement data paths of the memory module 50a. For example, the data path 80a may include a block 82a and/or the data buffer 70a. The data paths 80b-80n may have similar implementations. In the example shown, the memory module 50a may comprise five data paths (e.g., 80a-80e) on one side of the RCD 74 and five data paths (e.g., 80j-80n) on another side of the RCD 74. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). The RAM chips 84a-84n may be the SDRAM devices 72a-72n (e.g., the chips 84a-84n may comprise one or more of the circuits 72a-72n located within one of the memory channels 82a-82n). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate a clock signal (e.g., CLK), a number of control signals (e.g., ADDR/CMD) and/or a number of commands. The signal CLK and/or the signals ADDR/CMD may be presented to the RCD circuit 74. The commands may be presented to the PMIC 76 via a bus 64. A data bus 30 may be connected between the memory controller 20 and the data paths 80a-80n. The bus 30 may comprise traces, pins and/or connection between the memory controller 20 and the data buffers 70a-70n (or the memory channels 82a-82n for unbuffered memory that does not comprise the data buffers 70a-70n). The memory controller 20 may generate and/or receive data signals (e.g., DQa-DQn) and data strobe signals (e.g. DQSa-DQSn) that may be presented/received from the data bus 30. Portions of the signals DQa-DQn and DQSa-DQSn may be presented to respective data paths 80a-80n. For example, the signals DQa-DQn may be the DQ signals defined in the JEDEC specification and the signals DQSa-DQSn may be the DQS signals defined in the JEDEC specification. In the example shown, each of the signals DQa-DQn may have a corresponding signal DQSa-DQSn, however in some embodiments, one DQS signal may strobe multiple (e.g., four) DQ signals.

The RCD circuit 74 may be configured to communicate with the memory controller 20, the data buffers 70a-70n, the memory channels 82a-82n and/or the PMIC 76. The RCD circuit 74 may decode instructions (e.g., control words) received from the memory controller 20. For example, the RCD circuit 74 may receive register command words (RCWs). In another example, the RCD circuit 74 may receive buffer control words (BCWs). The RCD circuit 74 may be configured to train the DRAM chips 84a-84n, the data buffers 70a-70n and/or command and address lines between the RCD circuit 74 and the memory controller 20. For example, the RCWs may flow from the memory controller 20 to the RCD circuit 74. The RCWs may be used to configure the RCD circuit 74.

The RCD circuit 74 may be used in both LRDIMM and RDIMM configurations. The RCD circuit 74 may implement a 32-bit 1:2 command/address register. For example, the RCD circuit 74 may have two sets (e.g., A and B) of command/address outputs. The RCD circuit 74 may support an at-speed bus (e.g., a BCOM bus between the RCD circuit 74 and the data buffers 70a-70n). The RCD circuit 74 may implement automatic impedance calibration. The RCD circuit 74 may implement command/address parity checking. The RCD circuit 74 may control register RCW readback. In an example, the RCD circuit 74 may implement a serial communication bus (e.g., a 1 MHz inter-integrated circuit (I2C) bus, etc.). However, other types of management bus protocols (e.g., sideband interface, etc.) may be implemented to meet design criteria of particular implementations. In some embodiments, the RCD circuit 74 may implement a 12.5 MHz inter-integrated circuit (I3C) bus. Inputs to the RCD circuit 74 may be pseudo-differential using external and/or internal reference voltages. The clock outputs, command/address outputs, control outputs and/or data buffer control outputs of the RCD circuit 74 may be enabled in groups and independently driven with different strengths.

The RCD circuit 74 may receive the signal CLK and/or the signals ADDR/CMD from the memory controller 20. Various digital logic components of the RCD circuit 74 may be used to generate signals based on the signal CLK and/or the signals ADDR/CMD and/or other signals (e.g., RCWs). The RCD circuit 74 may also be configured to generate a signal (e.g., CLK') and signals (e.g., ADDR'/CMD'). The signal CLK' and/or the signals ADDR'/CMD' may be presented to each of the memory channels 82a-82n. In one example, the signals ADDR'/CMD' and CLK' may be transmitted on a common bus 52 and a common bus 54, respectively. In another example, the RCD circuit 74 may implement a single ADDR/CMD input and two ADDR'/CMD' outputs to support a 1:2 command/address architecture. The RCD circuit 74 may generate one or more signals (e.g., DBC). The signals DBC may be presented to the data buffers 70a-70n. The signals DBC may implement data buffer control signals. The signals DBC may be transmitted on a common bus 56 (e.g., a data buffer control bus).

The data buffers 70a-70n may be configured to receive commands and data from the bus 56. The data buffers 70a-70n may be configured to generate/receive data to/from the bus 30. The bus 30 may comprise traces, pins and/or connections between the memory controller 20 and the data buffers 70a-70n. A bus 58 may carry the data between each of the data buffers 70a-70n and respective memory channels 82a-82n. The data buffers 70a-70n may be configured to buffer data on the buses 30 and 58 for write operations (e.g., data transfers from the memory controller 20 to the corresponding memory channels 82a-82n). The data buffers 70a-70n may be configured to buffer data on the buses 30 and 58 for read operations (e.g., data transfers from the corresponding memory channels 82a-82n to the memory controller 20).

The data buffers 70a-70n may exchange data with the DRAM chips 84a-84n in small units (e.g., 4-bit nibbles for x4 DRAMS or 8-bit bytes for x8 DRAMs). In various embodiments, the DRAM chips 84a-84n may be arranged in multiple (e.g., two) sets. For two set/two DRAM chip (e.g., 84a-84b) implementations, each set may contain a single DRAM chip (e.g., 84a or 84b). Each DRAM chip 84a-84b may be connected to the respective data buffers 70a-70n through an upper nibble and a lower nibble, or a byte. For two set/four DRAM chip (e.g., 84a-84d) implementations, each set may contain two DRAM chips (e.g., 84a-84b or 84c-84d). A first set may be connected to the respective data buffers 70a-70n through the upper nibble. The other set may be connected to the respective data buffers 70a-70n through the lower nibble. For two set/eight DRAM chip (e.g., 84a-84h) implementations, each set may contain four of the DRAM chips 84a-84h. A set of four DRAM chips (e.g., 84a-84d) may connect to the respective data buffers 70a-70n through the upper nibble. The other set of four DRAM chips (e.g., 84e-84h) may connect to the respective data buffers 70a-70n through the lower nibble. Other numbers of sets, other numbers of DRAM chips, and other data unit sizes may be implemented to meet the design criteria of a particular implementation.

An interface 62 is shown. The interface 62 may be configured to enable communication between the RCD circuit 74 and the PMIC 76. For example, the interface 62 may implement a register clock driver/power management integrated circuit interface (e.g., a RCD-PMIC interface). The interface 62 may comprise one or more signals and/or connections. Some of the signals and/or connections implemented by the interface 62 may be unidirectional. Some of the signals and/or connections implemented by the interface 62 may be bidirectional. The interface 62 may be enabled by the host memory controller 20. In one example, the memory controller may enable the interface 62 for the RCD using the signal ADDR/CMD. In another example, the memory controller 20 may enable the interface 62 for the PMIC 76 by presenting an enable command.

The bus 64 may be implemented as a host interface bus. The host interface bus 64 may be bi-directional. The host interface bus 64 may be configured to communicate commands and/or other data to the PMIC 76 and/or other components of the memory module 50a. In some embodiments, the bus 64 may communicate with the RCD 74. In some embodiments, the host interface bus 64 may implement an I2C protocol. In some embodiments, the host interface bus 64 may implement an I3C protocol. The protocol implemented by the host interface 64 may be varied according to the design criteria of a particular implementation.

Figure 3:
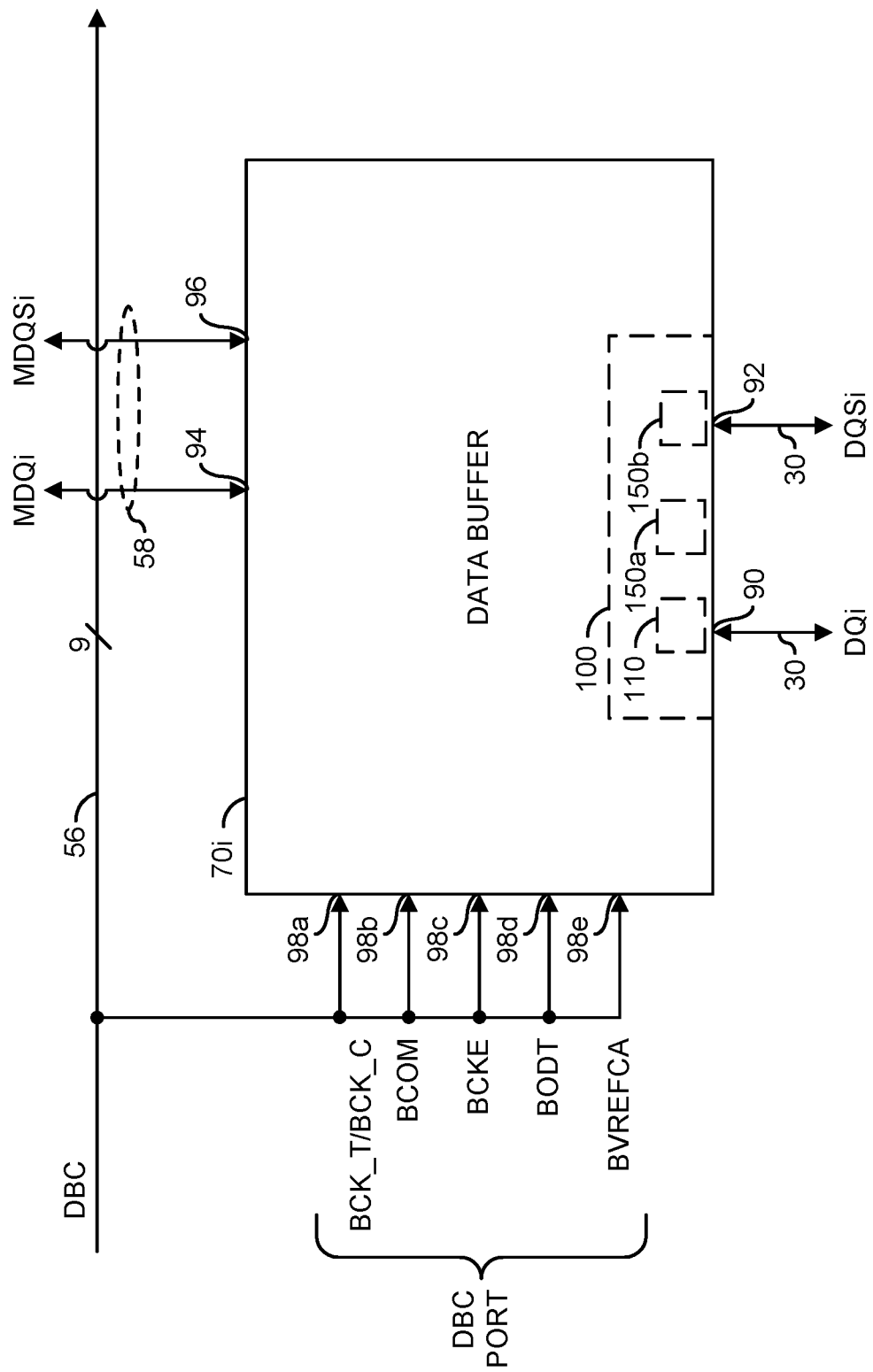
FIG. 3 is a block diagram illustrating a data buffer in accordance with an example embodiment of the invention.

Referring to FIG. 3, a block diagram illustrating a data buffer in accordance with an example embodiment of the invention is shown. The data buffer 70i may be representative of an example embodiment of the data buffers 70a-70n. The data buffer 70i is shown having a first input/output 90, a second input/output 92, a third input/output 94, and a fourth input/output 96.

The first input/output 90 is configured for presenting/receiving the signals DQi (e.g., the data signals DQ corresponding to a memory channel) between the data buffer 70i and the controller 20. The second input/output 92 is configured for presenting/receiving the signals DQSi (e.g., the data strobe signals DQS corresponding to the memory channel) between the data buffer 70i and the controller 20. The third input/output 94 is configured for presenting/receiving the signals DQi as memory input/output signals (e.g., MDQi) corresponding to a memory channel between the data buffer 70i and the respective memory devices (e.g., DRAM chips) 72a-72n. The fourth input/output 96 is configured for presenting/receiving the signals DQSi as memory input/output signals (e.g., MDQSi) corresponding to a memory channel between the data buffer 70i and the respective memory devices (e.g., DRAM chips) 72a-72n.

The signals MDQi and/or MDQSi are generally transmitted between the memory modules 72a-72n and the respective data buffers 70a-70n. In an example, data (e.g., the signals DQi) and/or a data strobe (e.g., the signal DQSi) from the memory controller 20 may be presented to the data buffer 70i, buffered in the data buffer 70i, then transmitted to the respective memory device(s) 72a-72n. In another example, data from the respective memory device(s) 72a-72n (e.g., MDQi) and/or a data strobe (e.g., the signal MDQSi) may be presented to the data buffer 70i, buffered in the data buffer 70i, and then transmitted on an appropriate memory channel to the memory controller 20.

The data buffer 70i is shown also receiving signals (e.g., DBC) from the bus 56 at a control port (e.g., DBC PORT). The signals DBC may be presented to the data buffers 70a-70n (e.g., using the data buffer control bus 56). In an example, the signals DBC are illustrated comprising five signals transmitted over 9 pins/bits (e.g., a pair of signals BCK_T/BCK_C, a signal BCOM, a signal BCKE, a signal BODT and/or a signal BVREFCA). However, other numbers of pins/bits may be implemented accordingly to meet the design criteria of a particular application. The control port of the data buffer 70*i* is shown having an input 98*a* receiving the signals BCK_T/BCK_C, an input 98*b* receiving the signal BCOM, an input 98*c* receiving the signal BCKE, an input 98*d* receiving the signal BODT, and an input 98*e* receiving the signal BVREFCA.

In various embodiments, the signals BCK_T/BCK_C may be implemented as a 2-bit signal representing a differential (e.g., true (T) and complementary (C) versions) clock signal for the duplex data buffers 70*a*-70*n*. In an example, the signals BCK_T/BCK_C may represent a system clock. In various embodiments, the signal BCOM may be implemented as a 4-bit signal representing data buffer commands. However, other numbers of bits may be implemented accordingly to meet the design criteria of a particular application. The signal BCOM may be implemented as a unidirectional signal from the RCD circuit 74 to the data buffers 70*a*-70*n*. In an example, the signal BCOM may be implemented at a single data rate (e.g., 1 bit per signal per clock cycle). However, a particular command may take a different number of clock cycles to transfer information. The signal BCKE may be a function registered dedicated non-encoded signal (e.g., DCKE). The signal BODT may be a function registered dedicated non-encoded signal (e.g., DODT). The signal BVREFCA may be a reference voltage for use with pseudo-differential command and control signals.

The data buffers 70*a*-70*n* may receive a set of data buffer commands (e.g., for writing buffer control words (BCWs)) from the signals DBC. The buffer control words may be used to customize operation of the data buffers 70*a*-70*n*. The buffer control words may flow from the memory controller 20, through the RCD circuit 74, to the data buffers 70*a*-70*n*. The buffer control words may be similar to register control words (RCWS) used for configuring the RCD circuit 74. Similar to commands for writing the register control words, the commands for writing the buffer control words may look like an MRS7 command, where the address lines are really the payload.

In embodiments where the bus 56 comprises nine pins, the RCD circuit 74 may do more than pass a buffer control word directly through to the data buffers 70*a*-70*n*. In one example, the RCD circuit 74 may convert (e.g., multiplex) an MRS7 command format into a buffer control word in a BCOM format. The RCD circuit 74 may map the 12 address bits of the MRS7 command into five separate data transfers, each 4 bits wide. The five data transfers may be set up back to back over the bus 56. For example, 5 clock cycles plus a parity cycle may be used to complete the buffer command in the buffer control word. Once the buffer control word reaches the data buffers 70*a*-70*n*, the data buffers 70*a*-70*n* may decode the buffer control word, write the buffer control word to a function space of the data buffer, and complete the buffer command in the buffer control word.

A function of the signal BCOM may be to transmit the buffer control words. However, compliant with the DDR5 standard, the RCD circuit 74 may send all read/write commands and MRS information over the bus 56 (e.g., to allow the data buffers 70*a*-70*n* to keep track of what the memory devices 72 are doing). In some embodiments, different buffer commands may take a different number of cycles to transfer the information.

The RCD circuit 74 may receive an MRS7 command from the memory controller 20 (e.g., from a host). For example, a host may want to change a parameter (e.g., typically on initialization or boot up of a computing device). The RCD circuit 74 may check the MRS7 command to determine whether the address bit 12 is set to 1 (e.g., a logical one). In an example, when an address bit 12 of the MRS7 command is set to 1, the RCD circuit 74 may recognize the command as a buffer command (e.g., a command that is not meant for the RCD circuit 74). The RCD circuit 74 may convert the command from the memory controller 20 to a buffer control word and send the buffer control word to the data buffers 70*a*-70*n* via the bus 56. The data buffers 70*a*-70*n* may write the buffer control word to a function space to complete the command.

The data buffers 70*a*-70*n* may be configurable. The buffer commands may allow the memory controller 20 to customize aspects of termination (e.g., ODT), signal strength on the DQ lines, and/or events (e.g., receiver timing, driver timing, etc.) in both directions (e.g., for both read and write operations). In some embodiments, some of the configurations of the data buffers 70*a*-70*n* may be decided based on system level configurations. Generally, most of the configuration of the data buffers 70*a*-70*n* may be decided during training steps. During training steps, host controllers (e.g., the memory controller 20) may test and compare results of various training steps to determine an optimal configuration.

In various embodiments, the bus 56 may be used to send commands/data to program configuration registers of the data buffers 70*a*-70*n*. The bus 56 may also send commands (e.g., data reads and/or data writes) that control data traffic through the data buffers 70*a*-70*n*. For example, some commands may optimize power consumption and noise filtering (e.g., equalization) of the data buffers 70*a*-70*n*. In another example, read/write delays may be added per data line.

The data buffers 70*a*-70*n* may implement dual multi-bit (e.g., 4-bit) bidirectional data registers with differential data strobes (e.g., DQS_T/DQS_C). The data buffers 70*a*-70*n* may implement automatic impedance calibration. The data buffers 70*a*-70*n* may implement BCOM parity checking. The data buffers 70*a*-70*n* may implement control register (e.g., buffer control word) readback.

In some embodiments, the data buffers 70*a*-70*n* may each comprise a block (or circuit or module or apparatus) 100. The circuit 100 may be implemented in one or more of the data buffers 70*a*-70*n*. The circuit 100 may implement a receiver to enable a data path structure configured to implement the auto-zeroing technique. In an example, the apparatus 100 may implement capacitive coupling for the auto-zeroing circuitry to simultaneously incorporate the DFE, VGA and/or EM functions into a single summation node. The apparatus 100 may tune idle-to-active timing for efficient power usage. For example, tuning the idle-to-active timing may reduce power compared to implementations that do not implement the auto-zeroing of the apparatus 100.

The circuit 100 may comprise a block (or circuit) 110 and/or blocks (or circuits) 150*a*-150*b*. The circuit 110 may implement a clock generator. The circuits 150*a*-150*b* may each implement a half-cell. The circuit 100 may comprise other components (not shown). The number, type and/or arrangement of the components of the circuit 100 may be varied according to the design criteria of a particular implementation.

In some embodiments, the apparatus 100 generally receives write data in the signal DQi through the input/output 90 and transfers the write data to the signal MDQi at the input/output 94. The apparatus 100 may also receive read data through the signal MDQi that is transferred to the signal DQi. The apparatus 100 may receive write synchronization information in the signal DQSi via the input/output 92. The apparatus 100 may also receive read synchronization information in the signal MDQSi via the input/output 96. In some embodiments, the apparatus 100 may be operational to provide communications with the data buffer 70i via the DBC port (e.g., the inputs 98a-98e). Logic modules implemented by the apparatus 100 may be configured to control operations of the data buffer 70i based upon commands received via the DBC port.

Figure 4:
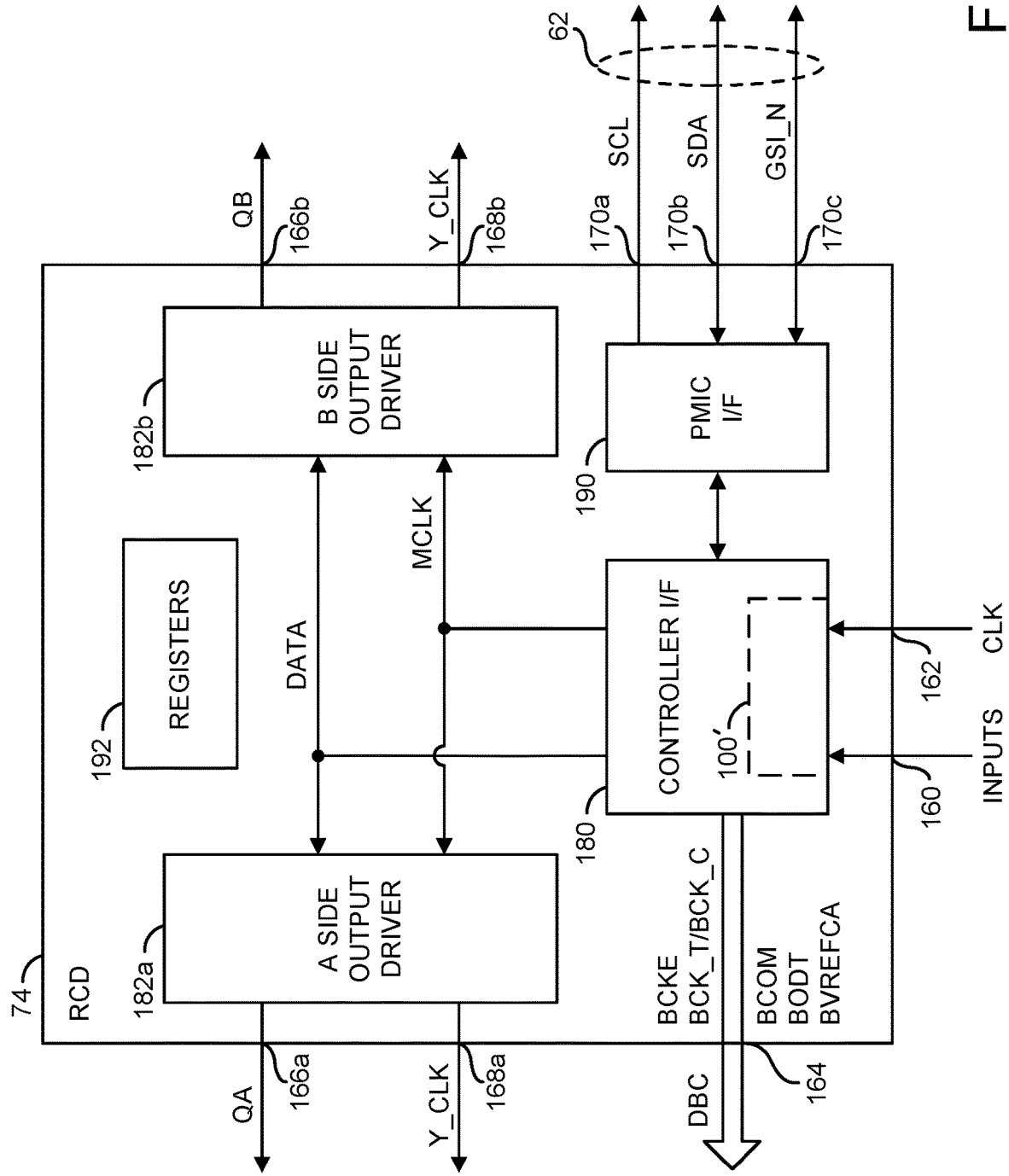
FIG. 4 is a diagram illustrating a registered clock driver in accordance with an example embodiment of the invention.

Referring to FIG. 4, a diagram illustrating a registered clock driver in accordance with an example embodiment of the invention is shown. In various embodiments, the circuit 74 may implement a registered clock driver circuit (or chip). In various embodiments, the circuit 74 may be compliant with the DDR5 standard.

The circuit 74 may have an input 160 that receives input data (e.g., INPUTS), an input 162 that receives the clock signal CLK, an input/output 164 that may receive/transmit control information (e.g., DBC), outputs 166a and 166b that may provide data outputs (e.g., the Q outputs QA and QB, respectively), outputs 168a and 168b that may provide output clock signals (e.g., Y_CLK) and/or inputs/outputs 170a-170c that may send/receive data via the interface 62. The signals INPUTS and CLK may be received from a memory controller (e.g., the memory controller 20 in FIG. 1) via a memory bus of a motherboard. In an example, the signals INPUTS may be pseudo-differential using an external or internal voltage reference. The signals INPUTS may comprise the ADDR/CMD signals of FIGS. 1 and 2. In an example, the signal CLK may be implemented as differential clock signals CLK_t (true) and CLK_c (complement). The signals QA, QB, and Y_CLK may be presented to a number of memory chips (e.g., 84a-84n in FIG. 2). For example, the signals QA, QB and Y_CLK may implement an output address and control bus for a DDR5 memory module. The signal DBC may be implemented as a data buffer control bus.

The output 170a may present a signal (e.g., SCL). The input/output 170b may communicate a signal (e.g., SDA). The input/output 170c may communicate a signal (e.g., GSI_N). The signal SCL may be a clock signal. The signal SDA may be a data signal. For example, the signal SDA may communicate power data. The signal GSI_N may be an interrupt signal. The signal SDA and/or the signal GSI_N may be a bi-directional signal. The signal SCL, the signal SDA and/or the signal GSI_N may each be a portion of the information communicated using the RCD-PMIC interface 62. The number of signals, the number of connections and/or the type of data communicated using the RCD-PMIC interface 62 may be varied according to the design criteria of a particular implementation.

In various embodiments the circuit 74 may comprise a block 180, blocks (or circuits) 182a-182b, a block (or circuit) 190 and/or a block (or circuit) 192. The block 180 may implement a controller interface. The blocks 182a and 182b may implement output driver circuits. In some embodiments, the blocks 182a and 182b may be combined as a single output driver circuit 182. The block 190 may implement a PMIC interface (or port) 190 in DDR5 implementations. The block 192 may implement register space. The RCD circuit 74 may comprise other components (not shown). The number, type and/or arrangement of the components implemented by the RCD 74 may be varied according to the design criteria of a particular implementation.

The block 180 may be configured to generate a data signal (e.g., DATA) and a clock signal (e.g., MCLK). The block 180 may be configured to generate the pair of signals (e.g., BCK_T/BCK_C), a signal (e.g., BCOM), a signal (e.g., BCKE), a signal (e.g., BODT) and/or a signal (e.g., BVREFCA). The signals DATA and MCLK may be presented to the blocks 182a and 182b. In various embodiments, the signal DATA may be coupled to the blocks 182a and 182b by combinatorial logic (not shown). The blocks 182a and 182b may be configured to generate the signals QA, QB and Y_CLK.

The block 190 may be configured to generate the signal SCL. The block 190 may be configured to generate and/or receive the signal SDA and/or the signal GSI_N. The block 190 may be coupled with the controller interface 180. For example, the PMIC interface 190 and/or the controller interface 180 may be configured to facilitate communication between the PMIC 76 and the memory controller 20. The PMIC interface 190 may be enabled in response to the enable command received from the host memory controller 20. In an example, the enable command may be a VR Enable command generated by the host memory controller 20.

The block 192 may be configured to store data. For example, the block 192 may comprise a number of registers used for reading from and/or writing to the RCD circuit 74. Generally, the register space 192 is coupled to the various components of the RCD using combinational logic (not shown). The block 192 may comprise a pre-defined register space to store and/or communicate power data received from and/or to be written to the PMIC 76. The pre-defined registers may store configuration data used to adjust an operating state and/or a status of the RCD 74, the interface 62 and/or the PMIC 76. In some embodiments, one or more counters may be implemented to track control words received from the host memory controller 20.

In various embodiments, the circuit 74 may be enabled to automatically adjust a skew time of a plurality of output pins during a manufacturing test operation. In various embodiments, the circuit 74 may be enabled to adjust the skew time (e.g., tSkew) to within a single gate delay of a reference output clock. As used herein, the term tSkew may be defined as the phase difference between an output data signal or pin (e.g., Q) and an output clock signal or pin (e.g., Y_CLK). In an example, a DDR5 standard registered clock driver (RCD) may have a number of pins defined by the DDR5 standard. However, other numbers of output pins may be implemented to meet the design criteria of a particular implementation.

The circuit 74 may be configured to adjust the phase of the output pins relative to the clock signal Y_CLK (or to respective copies of the clock signal Y_CLK) to meet manufacturer specifications (e.g., within +/−50 ps, etc.). The granularity of the phase adjustment is generally determined by delay elements within the circuit 74. During production testing, the circuit 74 may be configured to perform a trimming process in response to signals from automated test equipment and provide a pass/fail indication to the automated test equipment. In various embodiments, the circuit 74 may be utilized to implement the RCD in DDR5 memory modules.

The signal SCL may be a clock signal generated by the RCD 74. The signal SCL may be a clock signal that operates independently from the system clock signal (e.g., the signals BCK_T/BCK_C, the signal CLK and/or the signal MCLK)). In an example, the clock signal SCL may be an I2C clock output from the RCD 74 to the PMIC 76 communicated over the point-to-point interface 62. The signal SDA may be a data signal generated by the RCD 74 and/or received by the RCD 74. For example, the signal SDA may enable the host memory controller 20 to write to the PMIC 76 through the RCD 74 and/or read from the PMIC 76 through the RCD 74. In an example, the power data signal SDA may be an I2C data input/output between the RCD 74 and the PMIC 76 communicated over the point-to-point interface 62. The RCD 74 may use the interface 62 to send/receive the power data to/from the PMIC 76. The host memory controller 20 may perform a read operation and/or a write operation to the RCD 74 as defined by the DDR5 standard. For example, the host memory controller 20 may read the power data stored in the pre-defined registers. In another example, the host memory controller 20 may write instructions for the PMIC 76 into the pre-defined registers.

The RCD 74 may use the interface 62 to perform periodic polling and/or interrupt handling. The RCD 74 may use the interface 62 to communicate to the PMIC 76 that the memory module(s) 50a-50n are in a low powered state. The PMIC 76 may detect the notification from the interrupt signal GSI_N and respond accordingly.

In some embodiments, the RCD circuit 74 may comprise a block (or circuit) 100'. The circuit 100' may be a variation of the circuit 100. In some embodiments, the circuit 100' may be implemented wholly or partially within the circuit 180. The circuit 100' implemented within the RCD circuit 74 may be configured as the low power, auto-zeroing receiver. The circuit 100' may incorporate DFE, VGA and/or EM functionality. The circuit 100' may have a similar implementation and/or functionality in the RCD 74 as the circuit 100 shown in association with the data buffers 70a-70n (e.g., as shown in association with FIG. 3).

Figure 5:
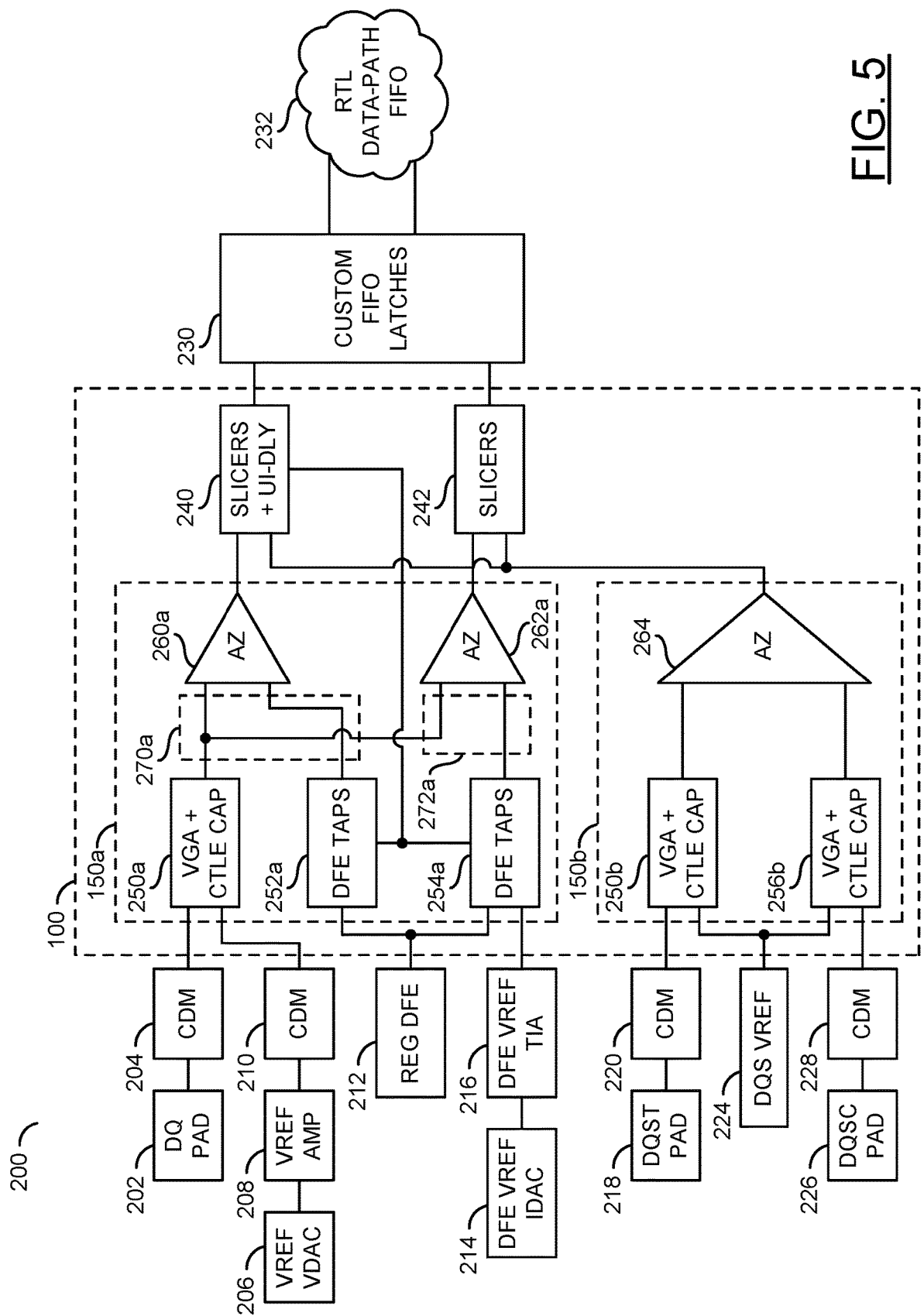
FIG. 5 is a diagram illustrating a receiver data path for data signals in accordance with an example embodiment of the invention.

Referring to FIG. 5, a diagram illustrating a receiver data path for data signals in accordance with an example embodiment of the invention is shown. A data path 200 is shown. In various embodiments, the data path 120 may be a receiver structure of the RCD 74. In other embodiments, the data path 120 may be part of the data buffers 70a-70n.

The data path 120 may comprise the apparatus 100. The data path 120 may further comprise a block (or circuit) 202, a block (or circuit) 204, a block (or circuit) 206, a block (or circuit) 208, a block (or circuit) 210, a block (or circuit) 212, a block (or circuit) 214, a block (or circuit) 216, a block (or circuit) 218, a block (or circuit) 220, a block (or circuit) 224, a block (or circuit) 226, a block (or circuit) 228, a block (or circuit) 230 and/or a block (or circuit) 232. The circuit 202 may implement a signal pad. The circuit 204 may implement a charged device model (CDM). The circuit 206 may implement a digital to analog circuit (DAC). The circuit 208 may implement a voltage amplifier. The circuit 210 may implement a CDM. The circuit 212 may implement a register. The circuit 214 may implement a DFE IDAC module. The circuit 216 may implement a trans-impedance amplifier (TIA). The circuit 218 may implement a signal pad. The circuit 220 may implement a CDM. The circuit 224 may implement a signal input. The circuit 226 may implement a signal pad. The circuit 228 may implement a CDM. The circuit 230 may implement FIFO latches. The circuit 232 may implement a data-path FIFO buffer. The data path 200 may comprise other components (not shown). The number, type and/or arrangement of the components of the data path 200 may be varied according to the design criteria of a particular implementation.

The signal pad 202 may be configured to communicate one or more of the signals DQa-DQn. The CDM 204 may be configured to characterize an electrostatic discharge (ESD) event that occurs when an device acquires charge through some triboelectric (frictional) and/or electrostatic induction processes and then abruptly touches a grounded object or surface. The CDM 210, the CDM 220 and/or the CDM 228 may provide a similar functionality. The CDM 204 may be connected to the receiver 100.

The DAC 206 may be configured to communicate a reference voltage (e.g., VREF). The amplifier 208 may be configured to provide an amplification of the reference voltage VREF. In some embodiments, the DAC 206 may be implemented as a voltage multiplexer configured to select a suitable reference voltage. For example, the voltage multiplexer of the reference voltage module 206 may select the reference voltage from one or more available reference voltage signals. In one example, one input signal of the data path 200 may be the signal selected by the DAC 206. The CDM 210 may be connected to the receiver 100 to provide the reference voltage VREF.

The registers 212 may be configured to store DFE values. For example, the registers may be configured to receive DFE coefficients from the receiver 100. The registers 212 may be one of the registers 192 of the RCD 74.

The DFE IDAC module 214 may be a reference voltage IDAC. The DFE IDAC module 214 may be configured to provide a constant (or programmable) current for DFE. The TIA 216 may be configured to convert the current from the DFE IDAC module 214 to a voltage usable by the receiver 100.

The signal pad 218 may be configured to communicate a signal (e.g., DQST). For example, the signal DQST may be one signal of a differential data strobe signal. The CDM 220 may provide a connection from the signal pad 218 to the receiver 100. The signal input 224 may provide a data strobe reference voltage to the receiver 100. The signal pad 226 may be configured to communicate a signal (e.g., DQSC). For example, the signal DQSC may be one signal of a differential data strobe signal. The CDM 228 may provide a connection from the signal pad 218 to the receiver 100.

The circuit FIFO latches 230 may comprise custom FIFO latches. The FIFO latches 230 may be configured to receive an output from the receiver 100. The data-path FIFO buffer 232 may represent an output of the data path 200. For example, the output of the data-path FIFO buffer 232 may be a data sampled at various clock signals (e.g., data sampled at even or odd clock signals).

Generally, the input data is transmitted through the data path 200 via the receiver 100. The data may be received by one or more of the components 202-228 and presented to the receiver 100. The receiver 100 may perform the auto-zero, the VGA, the DFE and/or the EM functionality. The data may be presented from the receiver 100 to the FIFO latches 230. The data path 200 may present output to the circuitry represented by the circuitry 232 sampled by one or more clocks. In the example shown, the data path 200 may receive data signal and/or data strobe signal inputs (e.g., the signals DQa-DQn and/or the signals DQSa-DQSn).

The receiver 100 is shown comprising the half-cells 150a-150n, a block (or circuit) 240 and/or a block (or circuit) 242. The circuit 240 may be a slicer circuit with DFE delay taps (e.g., for a main (or signal) path). The circuit 242 may be a slicer circuit (e.g., for an eye monitor path). The half-cell 150a may comprise a block (or circuit) 250a, a block (or circuit) 252a, a block (or circuit) 254a, a block (or circuit) 260a and/or a block (or circuit) 262a. The circuit 250a may implement a VGA and/or CTLE module. The circuit 252a may comprise a buffer. The circuit 254a may comprise a buffer. The circuit 260a may implement an auto-zero circuit for a main path. The circuit 262a may implement an auto-zero circuit for an eye monitor path. The half-cell 150*b* is shown comprising a block (or circuit) 250*b*, a block (or circuit) 256*b* and/or a block (or circuit) 264. The circuit 250*b* may implement a VGA and/or CTLE module. The circuit 256*b* may implement a VGA and/or CTLE module. The circuit 264 may represent an abstraction of an auto-zero circuit (e.g., both the main path auto-zero circuit and/or the eye monitor path auto-zero circuit). The receiver 100 may comprise other components (not shown). The number, type and/or arrangement of the components of the receiver 100 may be varied according to the design criteria of a particular implementation.

The VGA and/or CTLE module 250*a* may comprise one or more coupled capacitors. The VGA and/or CTLE module 250*a* may be configured to provide VGA functionality and/or continuous time linear equalizer (CTLE) functionality. For example, the CTLE functionality may be configured to select a gain value in response to the reference voltage provided by the CDM 210 and/or the DQ signal from the CDM 204. The output of the VGA and/or CTLE module 250*a* may be one input presented to the auto-zero circuit 260*a* and one input presented to the auto-zero circuit 262*a*. Similarly, the VGA and/or CTLE module 250*b* may present one input to the auto-zero circuit 264 in response to the CDM 220 providing the signal DQST and/or the DQS reference voltage. Similarly, the VGA and/or CTLE module 256*b* may present one input to the auto-zero circuit 264 in response to the CDM 228 providing the signal DQSC and/or the DQS reference voltage.

The main path slicer 240 may provide feedback to the buffer 252*a*. The buffer 252*a* may be a feedback buffer configured to present another input to the main path auto-zero circuit 260*a* in response to the register 212 and the feedback from the slicer 240. The auto-zero circuit 260*a* may provide one input the main path slicer 240. The auto-zero circuit 264 may present another input to the main path slicer 240.

The main path slicer 240 may provide feedback to the buffer 254*a*. The buffer 254*a* may be a feedback buffer configured to present another input to the eye monitor path auto-zero circuit 262*a* in response to the register 212, the feedback from the slicer 240 and/or the DFE reference voltage from the TIA circuit 216. The auto-zero circuit 262*a* may provide one input to the eye-monitor path slicer 242. The auto-zero circuit 264 may present another input to the eye-monitor path slicer 242.

A summation node 270*a* and a summation node 272*a* are shown for the half-cell 150*a*. The summation node 270*a* may correspond to an input of the auto-zero circuit 260*a*. The summation node 272*a* may correspond to an input of the auto-zero circuit 262*a*. Similarly, there may be summation nodes for the half-cell 150*b* (not shown). Details of the summation nodes and/or the components of the receiver 100 may be described in association with FIG. 6. Additional details of the receiver 100 may be described in U.S. patent application Ser. No. 16/357,609, filed on Mar. 19, 2020 (now U.S. Pat. No. 10,672,437), appropriate portions of which are hereby incorporated by reference.

Figure 6:
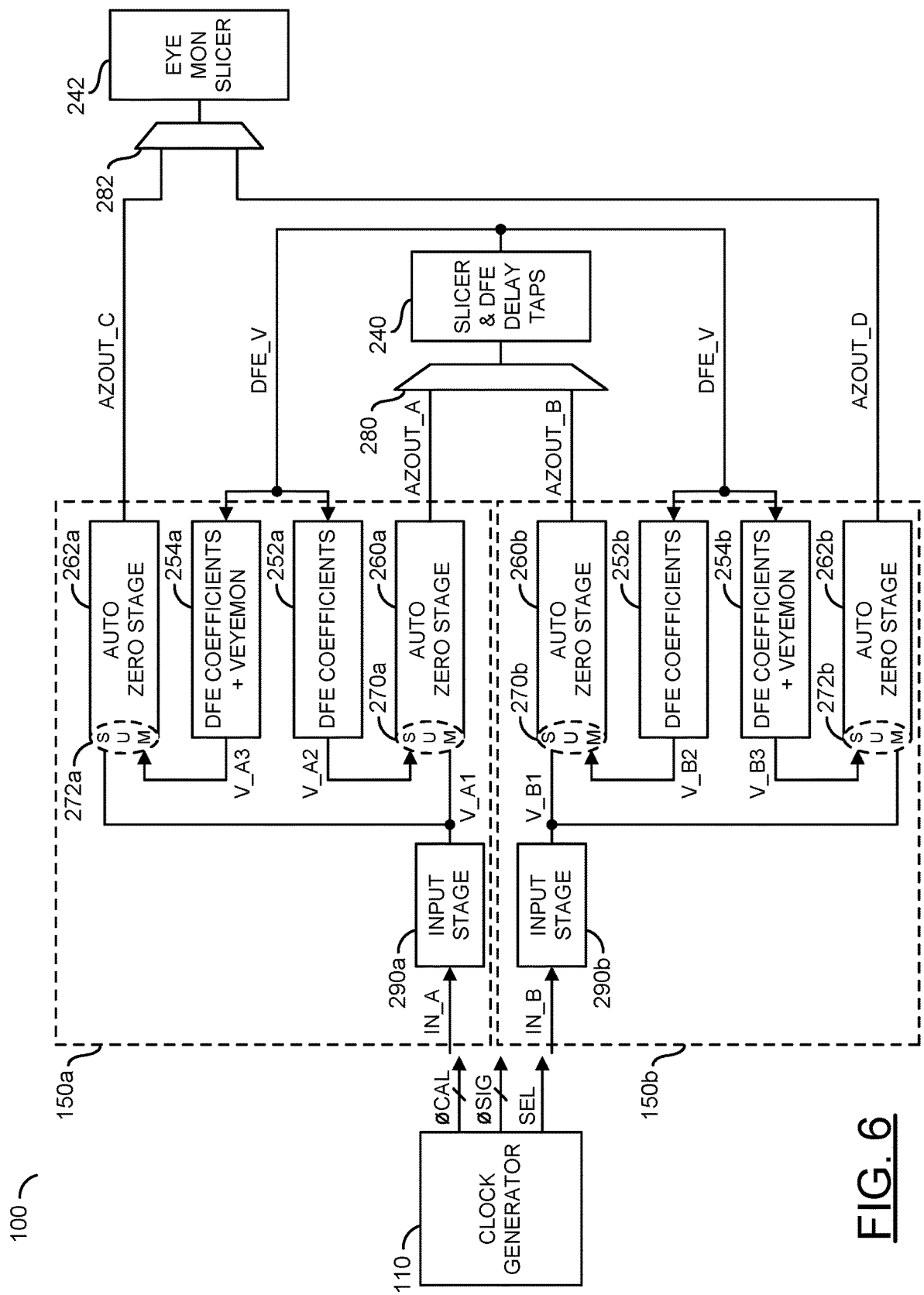
FIG. 6 is a block diagram illustrating two half-cells connected to a decision feedback equalizer and an eye-monitor circuit.

Referring to FIG. 6, a block diagram illustrating two half-cells connected to a decision feedback equalizer and an eye-monitor circuit is shown. A block diagram of the receiver 100 is shown. The receiver 100 may be configured to integrate the DFE into the auto-receiver. The receiver 100 may comprise the clock generator 110, the half-cells 150*a*-150*b*, the main path slicer with delay taps 240, the eye-monitor slicer 242, a block (or circuit) 280 and/or a block (or circuit) 282. The circuit 280 may implement a multiplexer for the main path. The circuit 282 may implement a multiplexer for the eye-monitor path. The receiver 100 may comprise other components (not shown). The components of the receiver 100 may be varied according to the design criteria of a particular implementation.

The clock generator 110 may implement a non-overlapping clock generator. The clock generator 110 may generate signals (e.g., CAL), signals (e.g., SIG) and/or a signal (e.g., SEL). The signals CAL and the signals SIG may represent phi signals generated by the clock generator 110. The phi signals CAL and/or SIG may be configured to control a timing of various components of the half-cells 150*a*-150*b*. The signal SEL may be configured to control the main path multiplexer 280 and/or the eye-monitor slicer 282. In one example, the clock generator 110 may comprise combination logic configured to output the phi signals and/or other timing signals in response to the signal CLK.

The apparatus 100 may receive signals (e.g., IN_A-IN_B). The signals IN_A-IN-B may be input signals. In one example, the signals IN_A-IN_B may correspond to one or more of the signal DQ, the signal DQST, the signal DQSC and/or the reference voltages shown in association with FIG. 5. The input signals IN_A-IN_B may be received by a respective one of the half-cells 150*a*-150*b*.

The half-cell 150*a* is shown comprising the feedback buffer 252*a*, the feedback buffer 254*b*, the auto-zero circuit 260*a*, the circuit 262*a* and/or a block (or circuit) 290*a*. Similarly, the half-cell 150*b* may comprise the feedback buffer 252*b*, the feedback buffer 254*b*, the auto-zero circuit 260*b*, the circuit 262*b* and/or a block (or circuit) 290*b*. The circuits 290*a*-290*b* may implement input stages. The input stages 290*a*-290*b* may correspond to one or more of the VGA and/or CTLE capacitor modules 250*a*-250*b* and/or 256 shown in association with FIG. 5. The half-cell 150*a* may comprise the main path summation node 270*a* and the eye-monitor summation node 272*a*. The half-cell 150*b* may comprise the main path summation node 270*b* and the eye-monitor summation node 272*b*.

The input stages 290*a*-290*b* may each be configured to generate a respective signal (e.g., V_A1-V_B1). The signal V_A1 may be received by the main path auto-zero circuit 260*a* and the eye-monitor path auto-zero circuit 262*a*. The signal V_B1 may be received by the main path auto-zero circuit 260*b* and the eye-monitor path auto-zero circuit 262*b*.

The auto-zero circuits 260*a*-260*b* may each be configured to generate a respective signal (e.g., AZOUT_A-AZOUT_B). The signals AZOUT_A-AZOUT_B may each be a respective output of the main path for the half-cells 150*a*-150*b* by the respective auto-zero circuits 260*a*-260*b*.

The main path multiplexer 280 may be configured to select between the output signals AZOUT_A-AZOUT_B. The main path multiplexer 280 may switch between selecting the signal AZOUT_A or the signal AZOUT_B in response to the signal SEL. The signal AZOUT_A or AZOUT_B may be presented to the main path slicer 240.

The main path slicer 240 may be configured to implement DFE functionality. The main path slicer 240 may be configured to sample DFE delay taps from the signals AZOUT_A-AZOUT_B. The main path slicer 240 may be configured to generate a signal (e.g., DFE_V). The signal DFE_V may comprise the DFE delay taps. The signal DFE_V may be presented as feedback to the half-cells 150*a*-150*b*. The signal DFE_V may be presented to the feedback buffer 252*a* and the feedback buffer 254*a* of the half-cell 150*a*. The signal DFE_V may be presented to the feedback buffer 252*b* and the feedback buffer 254*b* of the half-cell 150*b*.

The buffers 252a-252b may be configured to store the DFE coefficients. The buffers 252a-252b may receive the signal DFE_V that may comprise various voltage values for the DFE coefficients generated by the main path slicer 240. The buffer 252a may be configured to generate a signal (e.g., V_A2). The buffer 252a may present the signal V_A2 to the auto-zero circuit 260a. The buffer 252b may be configured to generate a signal (e.g., V_B2). The buffer 252b may present the signal V_B2 to the auto-zero circuit 260b.

The auto-zero stage 260a may be configured to receive the signal V_A1 from the input stage 290a as one input and the signal V_A2 from the buffer 252a as another input. For example, the signal V_A1 may provide an input value (e.g., one component of the differential signal DQ) and the signal V_A2 may provide a feedback value (e.g., generated in response to a previously received input value). The auto-zero stage 260a may generate the signal AZOUT_A in response to the signal V_A1 and the signal V_A2.

The auto-zero stage 260b may be configured to receive the signal V_B1 from the input stage 290b as one input and the signal V_B2 from the buffer 252b as another input. For example, the signal V_B1 may provide an input value (e.g., one component of the differential signal DQ) and the signal V_B2 may provide a feedback value (e.g., generated in response to a previously received input value). The auto-zero stage 260b may generate the signal AZOUT_B in response to the signal V_B1 and the signal V_B2.

The summation node 270a is shown for the auto-zero stage 260a and the summation node 270b is shown for the auto-zero stage 260b. The summation nodes 270a-270b may be achieved by performing a comparison of positive and negative signals that comprise the differential pair. One node of the differential pair may receive the signal through the input stages 290a-290b. For example, the auto-zero stage 260a may receive the signal V_A1 and the auto-zero stage 260b may receive the signal V_B1. The second node of the differential pair may receive the signal from the DFE taps with a corresponding coefficient for the main path. For example, the auto-zero stage 260a may receive the signal V_A2 and the auto-zero stage 260b may receive the signal V_B2. The difference of the two signals may be the DFE summation nodes 270a-270b. For example, the DFE summation node 270a may be viewed mathematically by subtracting V_A1-V_A2 and the DFE summation node 270b may be viewed mathematically by subtracting V_B1-V_B2. The summation may be mathematical due to differential pair operation.

The buffers 254a-254b may be configured to store the DFE coefficients. The buffers 254a-254b may further be configured to store a reference voltage for the eye-monitor. For example, the buffers 254a-254b may be configured to receive the reference voltage from the DFE IDAC module 214 and/or the TIA 216. The buffers 254a-254b may receive the signal DFE_V that may comprise various voltage values for the DFE coefficients generated by the main path slicer 240. The buffer 254a may be configured to generate a signal (e.g., V_A3). The buffer 254a may present the signal V_A3 to the auto-zero circuit 262a. The buffer 254b may be configured to generate a signal (e.g., V_B3). The buffer 254b may present the signal V_B3 to the auto-zero circuit 262b.

The auto-zero stage 262a may be configured to receive the signal V_A1 from the input stage 290a as one input and the signal V_A3 from the buffer 254a as another input. For example, the signal V_A1 may provide an input value (e.g., one component of the differential signal DQ) and the signal V_A3 may provide a feedback value (e.g., generated in response to a previously received input value and a reference voltage). The auto-zero stage 262a may generate the signal AZOUT_C in response to the signal V_A1 and the signal V_A3.

The auto-zero stage 262b may be configured to receive the signal V_B1 from the input stage 290b as one input and the signal V_B3 from the buffer 254b as another input. For example, the signal V_B1 may provide an input value (e.g., one component of the differential signal DQ) and the signal V_B3 may provide a feedback value (e.g., generated in response to a previously received input value and a reference voltage). The auto-zero stage 262b may generate the signal AZOUT_D in response to the signal V_B1 and the signal V_B3.

The summation node 272a is shown for the auto-zero stage 262a and the summation node 272b is shown for the auto-zero stage 262b. The summation nodes 272a-272b may be achieved by performing a comparison of positive and negative signals going into the differential pair. One node of the differential pair may receive the signal through the input stages 290a-290b. For example, the auto-zero stage 262a may receive the signal V_A1 and the auto-zero stage 262b may receive the signal V_B1. The second node of the differential pair may receive the signal from the DFE taps with a corresponding coefficient for the eye-monitor path. For example, the auto-zero stage 262a may receive the signal V_A3 and the auto-zero stage 262b may receive the signal V_B3. The difference of the two signals may be the DFE summation nodes 272a-272b. For example, the DFE summation node 272a may be viewed mathematically by subtracting V_A1-V_A3 and the DFE summation node 272b may be viewed mathematically by subtracting V_B1-V_B3. The summation may be mathematical due to differential pair operation.

The eye-monitor path multiplexer 282 may be configured to select between the output signals AZOUT_C-AZOUT_D. The eye-monitor path multiplexer 282 may switch between selecting the signal AZOUT_C or the signal AZOUT_D in response to the signal SEL. The signal AZOUT_C or AZOUT_D may be presented to the eye-monitor path slicer 242.

The eye-monitor path slicer 242 may be configured to implement eye-monitor functionality. The eye-monitor path slicer 242 may be configured to monitor the quality of the received signals. For example, the eye-monitor path slicer 242 may be configured to determine a mask-error rate for the signal AZOUT_C and/or the signal AZOUT_D.

The auto-zero receiver 100 may comprise two amplifiers (e.g., the half-cells 150a-150b). Implementing the two amplifiers 150a-150b may enable a continuous flow of data traffic. Each half-cell (e.g., in an example, the half-cell 150a) may enter a calibration phase while the other half-cell (e.g., in an example, the half-cell 150b) is in a signal phase. The signal phases of the two amplifiers 150a-150b may briefly overlap to prevent loss of signal information while one amplifier enters the signal phase and the other amplifier exits the signal phase in order to proceed to calibration. The calibration phase may be configured to sample the voltage offset of the amplifier and store the sampled voltage offset in an input sampling capacitor. The calibration phase may be configured to persist long enough for the amplifiers 150a-150b to settle to a correct voltage level. The amount of time for settling to the correct voltage level may be a minimum length of time for calibration. In an example, the eye-monitoring functionality may be performed during the calibration phase.

Figure 7:
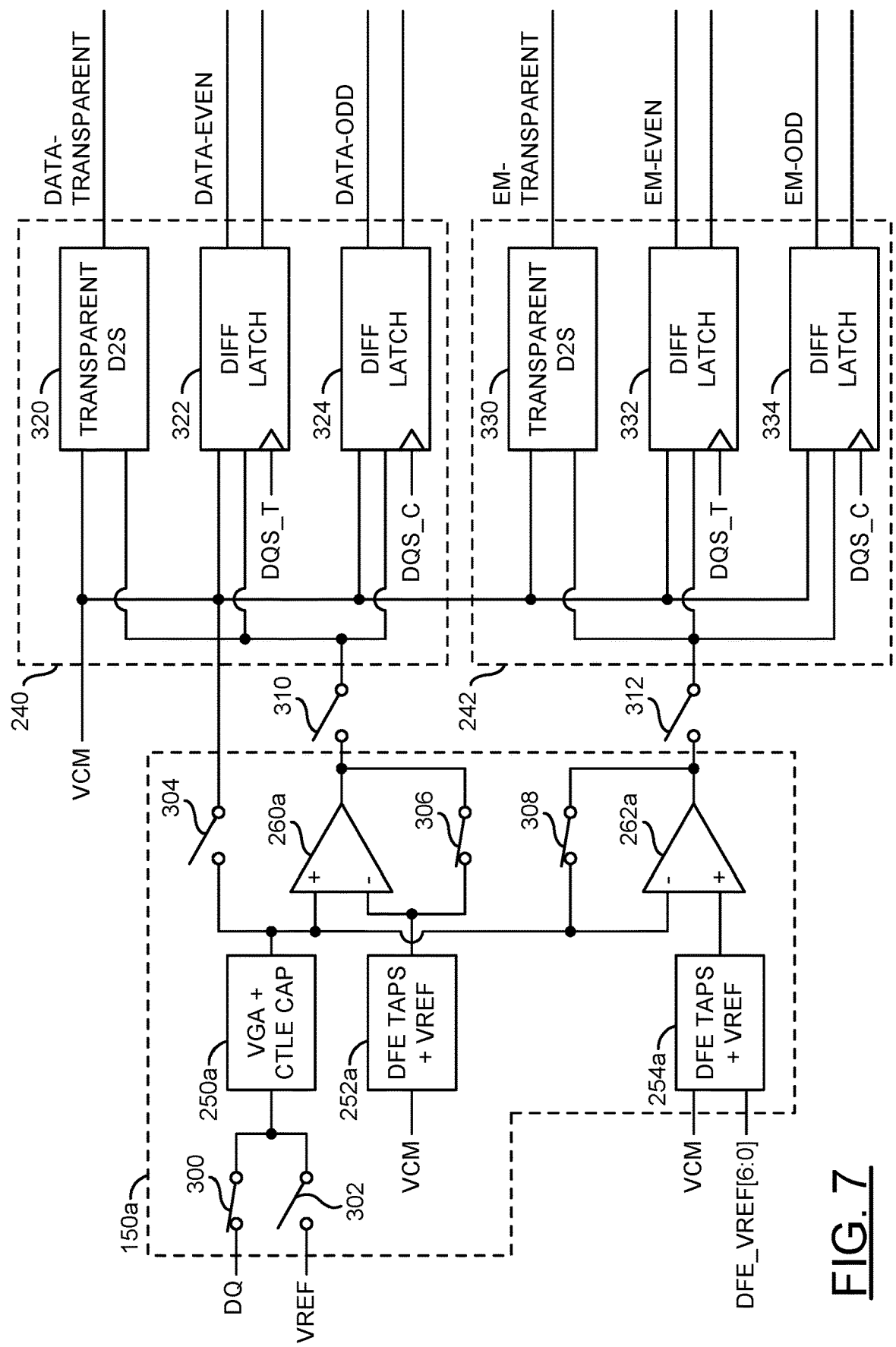
FIG. 7 is a diagram illustrating a decision feedback equalizer and an eye-monitor circuit integrated with a half-cell.

Referring to FIG. 7, a diagram illustrating a decision feedback equalizer and an eye-monitor circuit integrated with a half-cell is shown. Details of the half-cell 150a is shown. The details of the half-cell 150a may be applicable to the half-cell 150b. The half-cell 150a is shown connected to the main path slicer 240 and the eye-monitor path slicer 242.

The half-cell 150a is shown comprising the VGA and/or CTLE capacitor modules 250a, the feedback buffer 252b, the feedback buffer 254b, the main path auto-zero circuit 260a, the eye-monitor path auto-zero circuit 262a, a switch 300, a switch 302, a switch 304, a switch 306 and/or a switch 308. The half-cell 150a may receive the signal DQ, the signal VREF, a signal (e.g., VCM) and/or a signal (e.g., DFE_VREF[6:0]). The half-cell may comprise other components and/or receive and/or generate other signals (not shown). The input/output configuration of the half-cells 150a-150b may be varied according to the design criteria of a particular implementation.

The VGA and/or CTLE capacitor modules 250a may be configured to receive the signal DQ or the signal VREF. A state of the switch 300 may determine whether the VGA and/or CTLE capacitor modules 250a receive the signal DQ. A state of the switch 302 may determine whether the VGA and/or CTLE capacitor modules 250a receive the signal VREF. Generally, only one of the switches 300-302 may be in a closed state at a time (e.g., mutually exclusive switches). In the example shown, the switch 300 may be in the closed state and the switch 302 may be in an opened state (e.g., the VGA and/or CTLE capacitor modules 250a may receive the signal DQ). The switches 300-302 and/or the VGA and/or CTLE capacitor modules 250a may be represented as the input stage 290a shown in association with FIG. 6.

The output of the VGA and/or CTLE capacitor modules 250a (e.g., the CTLE/VGA input signal V_A1) may be presented to the auto-zero circuit 260a and the auto-zero stage 262a. For example, the signal DQ or the signal VREF may be presented to a positive differential input of the main path auto-zero stage 260a. For example, the signal DQ or the signal VREF may be presented to a negative differential input of the eye-monitor path auto-zero stage 262a. The CTLE/VGA input may be shared to both amplifiers 260a-262a which may result in a minimal added Cio effect.

The buffer 252a may receive the signal VCM. The signal VCM may be a common-mode voltage. The DFE input (e.g., the output of the buffer 252a) may be received by a negative differential input of the main path auto-zero circuit 260a. The buffer 254a may receive the signal VCM and the signal DFE_VREF[6:0]. The DFE/VREF input (e.g., the output of the buffer 254a) may be received by a positive differential input of the eye-monitor auto-zero circuit 262a. The DFE input and/or the VREF input may be generated through replica capacitor divider on the opposite pin of amplifiers 260a-262a. An input referred ratio of DFE feedback may track the DFE VREF across process, voltage, temperature (PVT). One trim or calibration may be required to set a relative capacitor-divider ratio to match input referred values.

The output of the auto-zero circuit 260a may be the signal AZOUT_A (not shown). The signal AZOUT_A may be presented to the main path slicer 240. A switch 310 is shown between the auto-zero circuit 260a and the main path slicer 240. When the switch 310 is closed the signal AZOUT_A may be presented to the main path slicer 240. The switch 306 is shown as a feedback path to the negative differential input to the auto-zero circuit 260a. In an example, when the switch 306 is closed there may be a calibrated main path input to VCM+VOS,EM+VOS,MAIN. In the example shown, the switch 310 may be in an opened state and the switch 306 may be in a closed state.

The output of the auto-zero circuit 262a may be the signal AZOUT_C (not shown). The signal AZOUT_C may be presented to the eye-monitor path slicer 242. A switch 312 is shown between the auto-zero circuit 262a and the eye-monitor path slicer 242. When the switch 312 is closed the signal AZOUT_C may be presented to the eye-monitor path slicer 242. The switch 308 is shown as a feedback path to the positive differential input to the auto-zero circuit 260a and to the negative differential input to the auto-zero circuit 262a. In an example, when the switch 308 is closed there may be calibrated eye-monitor input to VCM+VOS,EM. In the example shown, the switch 312 may be in an opened state and the switch 308 may be in a closed state.

The signal VCM is shown presented to the main path slicer 240, the eye-monitor path slicer and the half-cell 150a. The switch 304 may be located between the VGA/CTLE input (e.g., the positive differential input to the auto-zero circuit 260a and the negative differential input to the auto-zero circuit 262a) and the signal VCM input. The switch 304 is shown in an opened state. The switch 304 may be a VCM switch. The switch 304 may be used to enable the signal VCM to be used for calibration if the eye-monitor 242 is disabled.

The main path slicer 240 may comprise a block (or circuit) 320, a block (or circuit) 322 and/or a block (or circuit) 324. The circuit 320 may implement a D2S circuit. The circuit 322 may implement a differential latch. The circuit 324 may implement a differential latch. The main path slicer 240 may receive the signal VCM, the differential strobe signals DQS_T/DQS_C and/or the signal AZOUT_A. The main path slicer 240 may present a signal (e.g., DATA-TRANSPARENT), a signal (e.g., DATA-EVEN) and/or a signal (e.g., DATA-ODD). The main path slicer 240 may comprise other components and/or communicate other signals (not shown). The number, type, arrangement of the components and/or input/output of the main path slicer 240 may be varied according to the design criteria of a particular implementation.

The D2S module 320 may be a transparent D2S module. The D2S module 320 may be configured to receive the signal VCM and the signal AZOUT_A. The D2S module 320 may be configured to generate the signal DATA-TRANSPARENT in response to the signal VCM and the signal AZOUT_A.

The differential latch 322 may be configured to receive the differential strobe signal DQS_T, the signal VCM and the signal AZOUT_A. The differential latch 322 may be configured to generate the signal DATA-EVEN in response to the signal DQS_T, the signal VCM and the signal AZOUT_A. For example, the signal DATA-EVEN may comprise data (e.g., the signal DQ) sampled on even clock cycles.

The differential latch 324 may be configured to receive the differential strobe signal DQS_C, the signal VCM and the signal AZOUT_A. The differential latch 324 may be configured to generate the signal DATA-ODD in response to the signal DQS_C, the signal VCM and the signal AZOUT_A. For example, the signal DATA-ODD may comprise data (e.g., the signal DQ) sampled on odd clock cycles.

The eye-monitor path slicer 242 may comprise a block (or circuit) 330, a block (or circuit) 332 and/or a block (or circuit) 334. The circuit 330 may implement a D2S circuit. The circuit 332 may implement a differential latch. The circuit 334 may implement a differential latch. The eye-monitor path slicer 242 may receive the signal VCM, the differential strobe signals DQS_T/DQS_C and/or the signal AZOUT_C. The eye-monitor path slicer 242 may present a signal (e.g., EM-TRANSPARENT), a signal (e.g., EM-EVEN) and/or a signal (e.g., EM-ODD). The eye-monitor path slicer 242 may comprise other components and/or communicate other signals (not shown). The number, type, arrangement of the components and/or input/output of the eye-monitor path slicer 242 may be varied according to the design criteria of a particular implementation.

The D2S module 330 may be a transparent D2S module. The D2S module 330 may be configured to receive the signal VCM and the signal AZOUT_C. The D2S module 330 may be configured to generate the signal EM-TRANSPARENT in response to the signal VCM and the signal AZOUT_C.

The differential latch 332 may be configured to receive the differential strobe signal DQS_T, the signal VCM and the signal AZOUT_C. The differential latch 332 may be configured to generate the signal EM-EVEN in response to the signal DQS_T, the signal VCM and the signal AZOUT_C. For example, the signal EM-EVEN may comprise a mask error sampled on even clock cycles.

The differential latch 334 may be configured to receive the differential strobe signal DQS_C, the signal VCM and the signal AZOUT_C. The differential latch 334 may be configured to generate the signal EM-ODD in response to the signal DQS_C, the signal VCM and the signal AZOUT_C. For example, the signal EM-ODD may comprise a mask error sampled on odd clock cycles.

The embodiment of the apparatus 100 shown may provide a rail-to-rail common-mode input range. The apparatus 100 may implement a very high bandwidth and high current efficiency owing to inverter self-gain. The auto-zero stages 260a-262a (and the auto-zero stages 260b-262b) may automatically zero mismatches (e.g., voltage mismatch). In some embodiments, an output crossing may not match the following MUX threshold. A one-stage amplifier implementation may have less than 20 dB of gain across process-voltage-temperature (PVT) variations and may not work well for VdiVW_TOTAL 80 mV spec. During a calibration phase there may be unmanaged shoot-through current.

Figure 8:
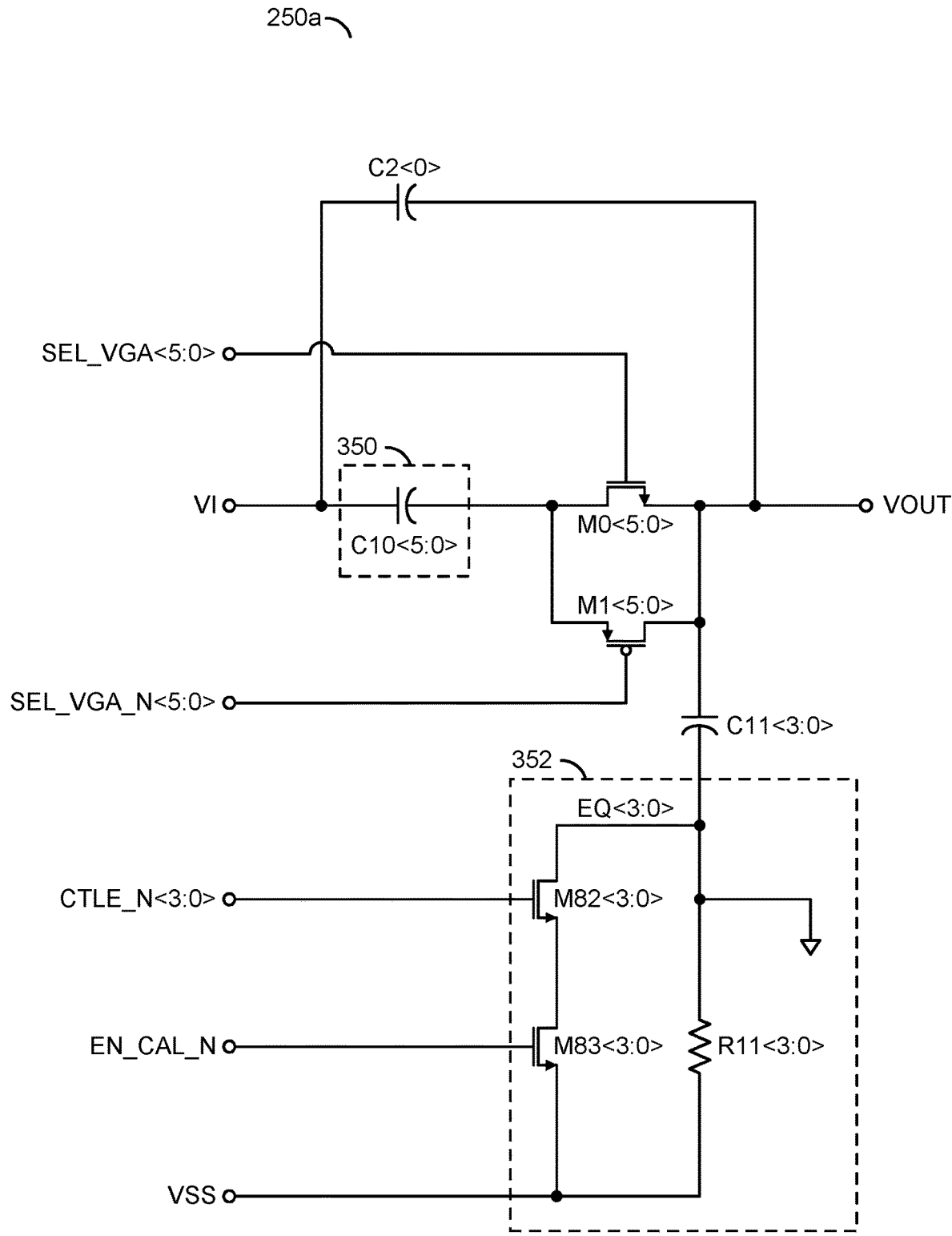
FIG. 8 is a diagram illustrating an example VGA capacitor divider circuit.

Referring to FIG. 8, a diagram illustrating an example VGA capacitor divider circuit is shown. The VGA and/or CTLE capacitor modules 250a is shown. The VGA and/or CTLE capacitor modules 250a may be a representative example of one or more components of the input stages 290a-290b.

The VGA and/or CTLE capacitor modules 250a may be configured to receive a signal (e.g., SEL_VGA<5:0>), a signal (e.g., VI), a signal (e.g., SEL_VGA_N<5:0>), a signal (e.g., CTLE_N<3:0>), a signal (e.g., EN_CAL_N) and/or a signal (e.g., VSS). The VGA and/or CTLE capacitor modules 250a may be configured to generate a signal (e.g., VOUT). The VGA and/or CTLE capacitor modules 250a may comprise a capacitance (e.g., C2), a capacitance, (e.g., C10), a capacitance (e.g., C11), a transistor (e.g., M0), a transistor (e.g., M1), a transistor (e.g., M82), a transistor (e.g., M83) and/or a resistor (e.g., R11). The VGA and/or CTLE capacitor modules 250a may comprise other components and/or signals (not shown). The number, type and/or arrangement of the components and/or input/output of the VGA and/or CTLE capacitor modules 250a may be varied according to the design criteria of a particular implementation.

The signal VI may be the signal IN_A shown in association with FIG. 6 (e.g., the signal DQ or the signal VREF).

The signal VI may be presented to a first end of the capacitance C10 and a first end of the capacitance C2. A second end of the capacitance C10 may provide the signal VI to a drain of the transistor M0 and a source of the transistor M1. A second end of the capacitance C2 may provide the signal VI to the source of the transistor M0, the drain of the transistor M1, a first end of the capacitance C11 and as the signal VOUT. A second end of the capacitance C11 may be further connected to the drain of the transistor M82, a first end of the resistor R11 and ground. The signal VOUT may be the VGA/CTLE input (e.g., presented to the signal V_A1 to the positive differential input of the auto-zero circuit 260a and the negative differential input of the auto-zero circuit 262a). The signal SEL_VGA<5:0> may be presented to a gate of the transistor M0. The signal SEL_VGA_N<5:0> may be presented to a gate of the transistor M1.

A signal (e.g., EQ<3:0>) is shown at a drain of the transistor M82. The signal CTLE_N<3:0> may be provided to the gate of the transistor M82. The source of the transistor M82 may be connected to the drain of the transistor M83. The signal EN_CAL_N may be provided to the gate of the transistor M83. The signal VSS may be provided at the source of the transistor M83. The signal VSS may be provided to a second end of the resistor R11. The first end of the resistor R11 may be connected to the ground node.

Capacitive coupling may be implemented between the capacitance C2, the capacitance C10 and/or the capacitance C11. The capacitive coupling may enable the VGA and/or CTLE functionality of the receiver 100. Switches may be added to the VGA and/or CTLE capacitor modules 250a to enable adjustment for the VGA functionality and/or the CTLE functionality. The capacitive coupling may enable simultaneous implementation of CTLE, DFE, EM and/or VGA functions into a single summation node. The capacitance C10 and the capacitance C2 may be the input sampling capacitors. For example, in the calibration phase, the sampling capacitors C10 and/or C2 may be configured to store the sampled voltage offset of the amplifiers 260a-262a.

A block (or circuit or module) 350 is shown. The block 350 may represent a combination of capacitors that implement the capacitance C10. In an example, six capacitors of the block 350 (e.g., <5:0>) may implement the capacitance C10. A block (or circuit or module) 352 is shown. The block 352 may comprise the switch M82 and the switch M83. The signal EQ<3:0> may represent a combination of the state of the switches M82 and the switch M83. A ratio of the number of capacitors enabled in the block 350 to the number of the switches enabled in the block 352 may be configured to be a transfer function for the VGA functionality of the receiver 100 and/or a transfer function for the CTLE functionality of the receiver 100.

Figure 9:
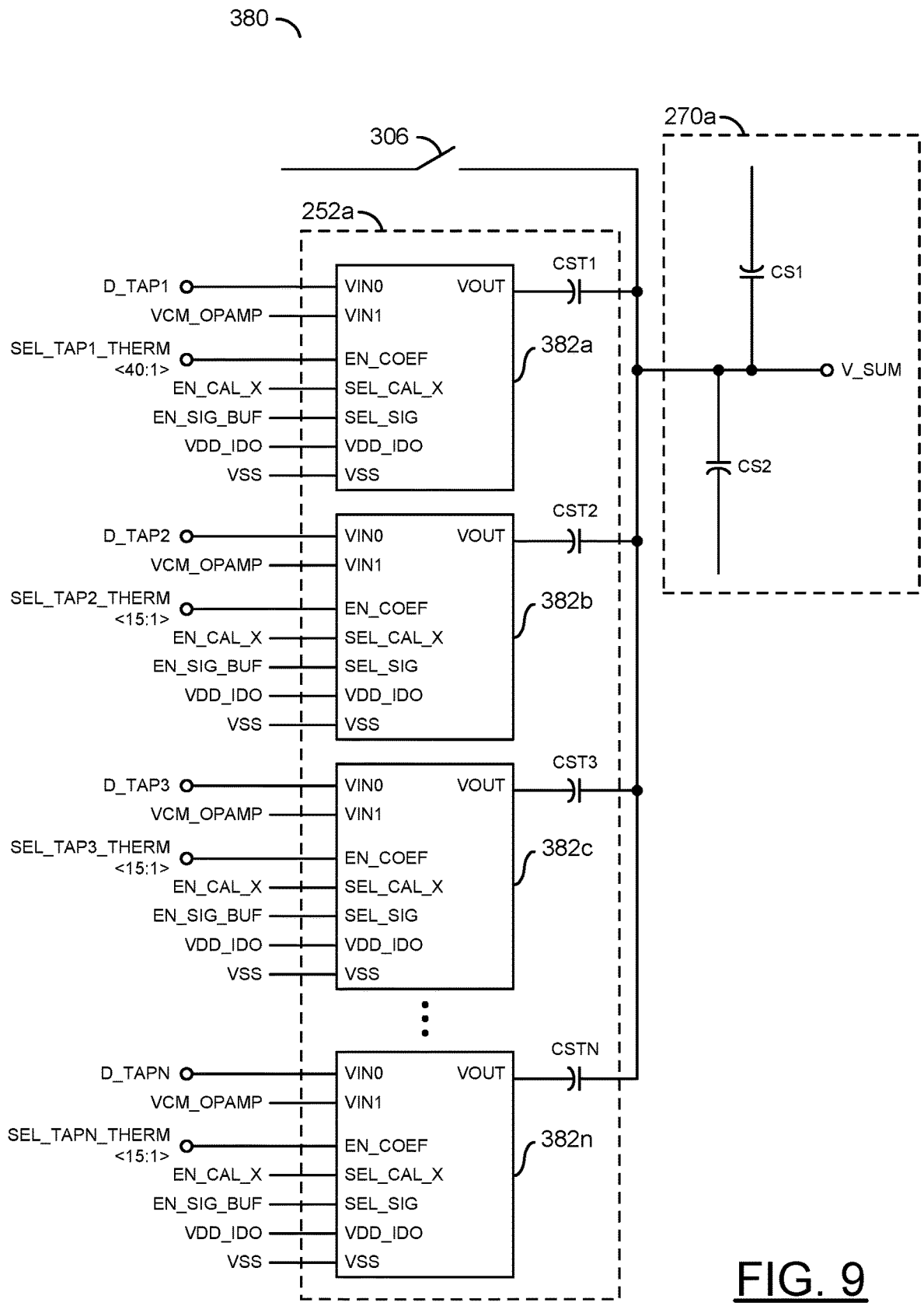
FIG. 9 is a block diagram illustrating DFE tap coefficient selection and calibration for the main path.

Referring to FIG. 9, a block diagram illustrating DFE tap coefficient selection and calibration for the main path is shown. A block diagram 380 is shown. The block diagram 380 may comprise details of the DFE coefficients feedback buffer 252a and/or the summation node 270a shown in association with FIGS. 6-7. The switch 306 may be connected to the output of the DFE coefficients feedback buffer 252a and the input of the summation node 270a. The switch 306 may control a status of an enable calibration input (e.g., en_cal) for the receiver 100.

The DFE coefficients feedback buffer 252a may comprise a number of blocks (or circuits) 382a-382n. The circuits 382a-382n may implement tap coefficient multiplexers. Each of the tap coefficient multiplexers 382a-382n may be connected to a respective one of the capacitances CST1-CSTN (e.g., feedback capacitances). For example, an output of the tap coefficient multiplexer 382a may be connected to the capacitance CST1, the tap coefficient multiplexer 382b may be connected to the capacitance CST2, the tap coefficient multiplexer 382c may be connected to the capacitance CST3, etc. The capacitances CST1-CSTN may connect to the summation node 270a. In the example shown, four of the tap coefficient multiplexers 382a-382n (and capacitances CST1-CSTN) are shown. However, any number of tap coefficient multiplexers 382a-382n may be implemented. The DFE coefficients feedback buffer 252a may comprise other components (not shown). The number, type and/or arrangement of the components of the DFE coefficient feedback buffer 252a may be varied according to the design criteria of a particular implementation.

Each of the tap coefficient multiplexers 382a-382n may comprise a number of input ports and an output port. The input ports for each of the tap coefficient multiplexers 382a-382n may comprise a VIN0 port, a VIN1 port, a EN_COEF port, a SEL_CAL_X port, a SEL_SIG port, a VDD_IDO port and/or a VSS port. The output port of each of the tap coefficient multiplexers 382a-382n may be a VOUT port. The VOUT port may be connected to a respective one of the capacitances CST1-CSTN.

Each of the VIN0 ports of the tap coefficient multiplexers 382a-382n may receive a respective one of input signals (e.g., D_TAP1-D_TAPN). The signals D_TAP1-D_TAPN may be the DFE tap coefficients. The DFE tap coefficients may be provided by the signal DFE_V generated by the main path slicer 240. Each of the VIN1 ports of the tap coefficient multiplexers 382a-382n may receive a signal (e.g., VCM_OPAMP). The signal VCM_OPAMP may be the common mode voltage VCM.

Each of the EN_COEF ports of the tap coefficient multiplexers 382a-382n may receive a respective one of input signals (e.g., SEL_TAP1_THERM-SEL_TAPN_THERM). The signal SEL_TAP1_THERM may be a signal comprising forty components. The signals SEL_TAP2_THERM-SEL_TAPN_THERM may be a signal comprising fifteen components. The signals SEL_TAP1_THERM-SEL_TAPN_THERM may be used as an enable calibration signal. For example, when the signals SEL_TAP1_THERM-SEL_TAPN_THERM are in an inactive state, the DFE coefficient (e.g., the output of the tap coefficient multiplexer) may be disabled. In an example, the signal VCM may be provided at the output at the output VOUT.

Each of the SEL_CAL_X ports of the tap coefficient multiplexers 382a-382n may receive a signal (e.g., EN_CAL_X). The signal EN_CAL_X may be used to select a calibration input. For example, when the signal EN_CAL_X and a respective one of the signals SEL_TAP1_THERM-SEL_TAPN_THERM are in an active state, the input of the port VIN1 (e.g., the common mode voltage VCM) may be presented on the output port VOUT. When either of a respective one of the SEL_TAP1_THERM-SEL_TAPN_THERM signals or the signal EN_CAL_X is not in an active state, the input of the VIN1 port may be disabled.

Each of the SEL_SIG ports of the tap coefficient multiplexers 382a-382n may receive a signal (e.g., EN_SIG_BUF). The signal EN_SIG_BUF may be used to select a signal input. For example, when the signal EN_SIG_BUF and a respective one of the signals SEL_TAP1_THERM-SEL_TAPN_THERM are in an active state, the input of the port VIN0 (e.g., a respective one of the tap coefficients D_TAP1-D_TAPN) may be presented on the output port VOUT. When either of a respective one of the SEL_TAP1_THERM-SEL_TAPN_THERM signals or the signal EN_SIG_BUF is not in an active state, the input of the VIN0 port may be disabled.

Each of the VDD_IDO ports of the tap coefficient multiplexers 382a-382n may receive a signal (e.g., VDD_IDO). Each of the VSS ports of the tap coefficient multiplexers 382a-382n may receive the signal VSS. The signal VDD_IDO and the signal VSS may comprise reference and/or supplied input voltages. For example, the signal VDD_IDO may be a voltage at a diode. In another example, the signal VSS may be a source voltage.

Each of the tap coefficient multiplexers 382a-382n may operate in one of three states (e.g., a signal state, a calibration state and a disabled state). The state of operation of the tap coefficient multiplexers 382a-382n may be changed depending on the status of the signal EN_CAL_X, the signal EN_SIG_BUF and/or the respective one of the signals SEL_TAP1_THERM-SEL_TAPN_THERM.

The tap coefficient multiplexers 382a-382n may operate in the signal state when the signal EN_SIG_BUF and the respective one of the signals SEL_TAP1_THERM-SEL_TAPN_THERM are both in an active state. In the signal state, the input port VIN0 may be selected to be presented as the output port VOUT. In the signal state, the coefficient (e.g., D_TAP1-D_TAPN) may be selected. The data of the signals D_TAP1-D_TAPN may swing between a high voltage threshold value and a low voltage threshold value (e.g., Vih to Vil). The output current of the port VOUT may be presented to the respective one of the capacitances CST1-CSTN.

The tap coefficient multiplexers 382a-382n may operate in the calibration state when the signal EN_CAL_X and the respective one of the signals SEL_TAP1_THERM-SEL_TAPN_THERM are both in an active state. In the calibration state, the input port VIN1 may be selected to be presented as the output port VOUT. When the calibration phase is enabled, the common mode voltage VCM may be selected to be applied to the ac coupling capacitor. The common mode voltage may be selected as half of a sum of the high voltage threshold value and the low voltage threshold value (e.g., [Vih+Vil]/2). The output current of the port VOUT may be presented to the respective one of the capacitances CST1-CSTN.

The tap coefficient multiplexers 382a-382n may operate in the disabled state when the tap coefficient is set to zero (e.g., the respective one of the signals SEL_TAP1_THERM-SEL_TAPN_THERM are in an inactive state). In the disabled state, neither of the input port VIN0 nor the input port VIN1 may be selected to be presented as the output port VOUT. The output VOUT may be tied to ground, which may be presented to the respective one of the capacitances CST1-CSTN. Tying the respective capacitances CST1-CSTN to ground may ensure that there is no toggle during the signal mode of operation.

The tap coefficient multiplexers 382a-382n may be configured to implement a precise DFE step size. The tap coefficient multiplexers 382a-382n may be configured to determine how many of the capacitances CST1-CSTN to toggle during the signal mode of operation. The capacitive coupling for the summation node 270a may be controlled by a transfer function. A transfer function for each DFE tap may be determined by a capacitor divider where n1 through nn may be the total number of DFE capacitors CST1-CSTN and m1 through mn may be the number of the tap coefficient multiplexers 382a-382n that have the input for the VIN0 port selected as the output VOUT. For example, an amplitude of DFE tap1 may be Vswing*m1*C/(n1*C+ n2*C+ ... +nn*C), an amplitude of DFE tap2 may be Vswing*m2*C/(n1*C+n2*C+ ... +nn*C), an amplitude of DFE tapn may be Vswing*mn*C/(n1*C+n2*C+ ... +nn*C), where Vswing may be a voltage between Vih and Vil.

The summation node 270a is shown. The summation node 270a may comprise a capacitance CS1 and a capacitance CS2. The summation node 270a may be presented a signal (e.g., V_SUM). The capacitance CS1 and/or the capacitance CS2 may operate as a shunt capacitor. The signal V_SUM may be generated as a result of the combination (e.g., the capacitive coupling) of the capacitances CST1-CSTN selected by the tap coefficient multiplexers 382a-382n.

During a calibration mode of the receiver 100, all of the tap coefficient multiplexers 382a-382n may be set to the calibration mode. The auto-zero stage 260a may set the node voltage V_SUM through the switch 306. The tap coefficient multiplexers 382a-382n may select the common mode voltage VCM at the input port VIN1 as the output port VOUT. The signal VCM may be (Vih+Vil)/2.

Figure 10:
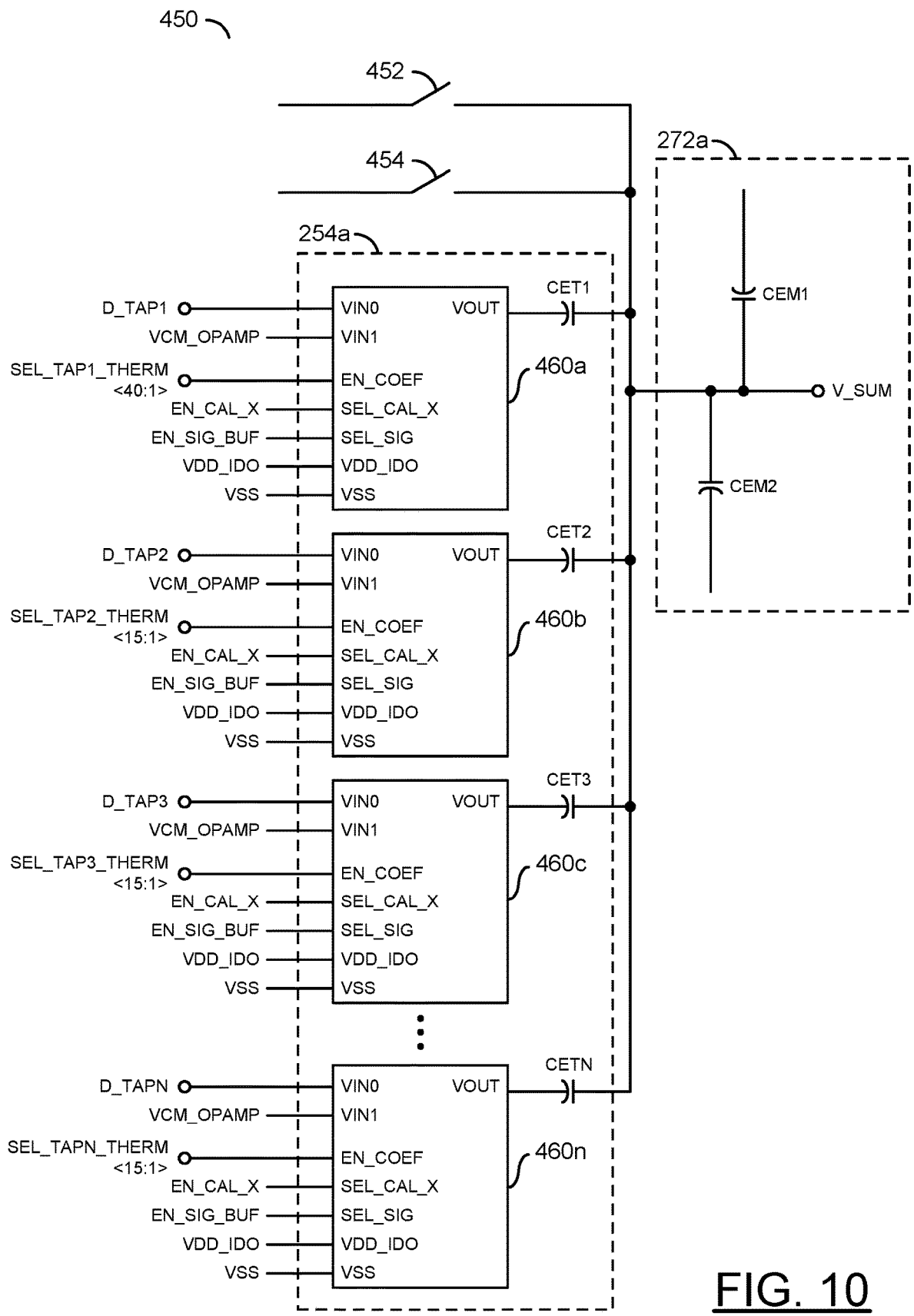
FIG. 10 is a block diagram illustrating DFE tap coefficient selection and calibration for the eye monitor path.

Referring to FIG. 10, a block diagram illustrating DFE tap coefficient selection and calibration for the eye monitor path is shown. A block diagram 450 is shown. The block diagram 450 may comprise details of the DFE coefficients and eye monitor feedback buffer 254a and/or the summation node 272a shown in association with FIGS. 6-7. The switch 452 and a switch 454 may be connected to the DFE coefficients and eye monitor feedback buffer 254a and the input of the summation node 272a. The switch 452 may control a reference voltage input (e.g., en_dfe_vref) for the receiver 100. The switch 454 may control a status of an enable calibration input (e.g., en_cal) for the receiver 100. In an example, the switch 452 may be implemented at an input of the DFE coefficients and eye monitor feedback buffer 254a that receives the signal DFE_VREF[6:0] and the switch 454 may be implemented at an input of the DFE coefficients and eye monitor feedback buffer 254a that receives the signal VCM. For example, the switch 452 and the switch 454 may have an implementation similar to the switch 300 and the switch 302 shown in association with FIG. 7.

The DFE coefficients and eye monitor feedback buffer 254a may comprise a number of blocks (or circuits) 460a-460n. The circuits 460a-460n may implement tap coefficient multiplexers. Each of the tap coefficient multiplexers 460a-460n may have a similar configuration as the tap coefficient multiplexers 382a-382n shown in association with FIG. 9. Each of the tap coefficient multiplexers 460a-460n may be connected to a respective one of the capacitances CET1-CETN (e.g., feedback capacitances). For example, an output of the tap coefficient multiplexer 460a may be connected to the capacitance CET1, the tap coefficient multiplexer 460b may be connected to the capacitance CET2, the tap coefficient multiplexer 460c may be connected to the capacitance CET3, etc. The capacitances CET1-CETN may connect to the summation node 272a. In the example shown, four of the tap coefficient multiplexers 460a-460n (and capacitances CET1-CETN) are shown. However, any number of tap coefficient multiplexers 460a-460n may be implemented. The DFE coefficients and eye monitor feedback buffer 254a may comprise other components (not shown). The number, type and/or arrangement of the components of the DFE coefficients and eye monitor feedback buffer 254a may be varied according to the design criteria of a particular implementation.

The summation node 272a is shown. The summation node 272a may comprise a capacitance CEM1 and a capacitance CEM2. The summation node 272a may be presented a signal (e.g., V_SUM). The capacitance CEM1 and/or the capacitance CEM2 may operate as a shunt capacitor. The signal V_SUM may be generated as a result of the combination (e.g., the capacitive coupling) of the capacitances CET1-CETN selected by the tap coefficient multiplexers 460a-460n.

The tap coefficient multiplexers 460a-460n may be configured to implement a precise eye monitor step size. The eye monitor path may use the additional switch 452 and an extra calibration phase to set the DFE reference voltage DFE_VREF[6:0]. The additional switch 452 may change the common-mode voltage of the DFE tap path so that an offset voltage is applied to the positive differential input of auto-zero circuit 262a.

In the calibration phase of operation for the DFE coefficients and eye monitor feedback buffer 254a, the en_cal switch 452 may be closed and the switch 306 for the main path auto zero circuit 260a and the switch 308 for the eye monitor auto zero circuit 262a may be closed. All of the main path tap coefficient multiplexers 382a-382n and the eye monitor tap coefficient multiplexers may be in the calibration state of operation or the disabled state of operation.

In the extra stage of operation for the eye monitor path tap coefficient multiplexers 460a-460n (e.g., the DFE_VREF stage mode of operation), the en_cal switch 306, the en_cal switch 308 and/or the en_cal switch 454 may be opened and the en_dfe_vref switch 452 may be closed. All of the main path tap coefficient multiplexers 382a-382n and the eye monitor tap coefficient multiplexers may be in the calibration state of operation or the disabled state of operation.

Although embodiments of the invention have been described in the context of a DDR5 application, the present invention is not limited to DDR5 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future memory specifications.

The functions performed by the diagrams of FIGS. 1-10 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMs (random access memories), EPROMs (erasable programmable ROMs), EEPROMs (electrically erasable programmable ROMs), UVPROMs (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a first half-cell comprising a first input stage, a first auto-zero stage, a second auto-zero stage and a first feedback buffer, wherein said first input stage is configured to present a first differential input to said first auto-zero stage and said second auto-zero stage;
   a second half-cell comprising a second input stage, a third auto-zero stage, a fourth auto-zero stage and a second feedback buffer, wherein said second input stage is configured to present a second differential input to said third auto-zero stage and said fourth auto-zero stage;
   a multiplexer configured to (a) receive a first output from said first auto-zero stage, (b) receive a second output from said third auto-zero stage and (c) present a decision feedback input comprising one of said first output and said second output; and
   a decision feedback equalizer configured to (i) generate a feedback signal in response to said decision feedback input and (ii) present said feedback signal to said first feedback buffer and said second feedback buffer, wherein (a) said first output is generated in response to said first differential input and said feedback signal and (b) said second output is generated in response to said second differential input and said feedback signal.

2. The apparatus according to claim 1, wherein (i) said first auto-zero stage comprises a first summation node, said second auto-zero stage comprises a second summation node, said third auto-zero stage comprises a third summation node, and said fourth auto-zero stage comprises a fourth summation node (ii) said first summation node, said second summation node, said third summation node and said fourth summation node each implement a capacitive coupling.

3. The apparatus according to claim 2, wherein (i) said feedback signal is generated based on a feedback transfer function and (ii) said feedback transfer function is combined with said first differential input and said second differential input by feedback capacitors connected to said first summation node, said second summation node, said third summation node and said fourth summation node.

4. The apparatus according to claim 3, an amplitude of said feedback signal is controlled by a number of said feedback capacitors being driven by said first feedback buffer and said second feedback buffer.

5. The apparatus according to claim 2, wherein each of said first auto-zero stage, said second auto-zero stage, said third auto-zero stage and said fourth auto-zero stage is configured to operate as a pre-amplifier to increase an amplitude of signals at a respective one of said first summation node, said second summation node, said third summation node and said fourth summation node.

6. The apparatus according to claim 2, wherein (i) said capacitive coupling is implemented at a summation node and (ii) said capacitive coupling at said summation node enables said apparatus to simultaneously implement functions of a continuous time linear equalizer, a variable gain amplifier, a decision feedback equalizer, and eye monitoring.

7. The apparatus according to claim 1, wherein an input signal transfer function is dependent on a variable capacitance value to implement a variable gain amplification (VGA) function.

8. The apparatus according to claim 1, further comprising an eye monitor slicer configured to receive an eye monitor input from an eye path multiplexer, wherein (i) said second auto-zero stage is configured to generate a first eye path signal in response to (a) said first differential input, (b) said feedback signal and (c) a reference voltage, (ii) said fourth auto-zero stage is configured to generate a second eye path signal in response to (a) said second differential input, (b) said feedback signal and (c) said reference voltage, and (iii) said eye path multiplexer is configured to present said eye monitor input by selecting one of said first eye path signal and said second eye path signal.

9. The apparatus according to claim 1, wherein said apparatus comprises a receiver for a memory interface compliant with a DDR5 JEDEC specification with speeds ranging from 260 Mbps to 5 Gbps.

10. The apparatus according to claim 1, wherein said apparatus is configured to (i) implement a precise step size for said decision feedback equalizer, (ii) implement a precise step size for an eye-monitor, (iii) implement a wide common mode range, (iv) operate with low power consumption and (v) operate at a bandwidth greater than 5 Gbps.

11. The apparatus according to claim 1, wherein said first input stage and said second input stage are configured to implement a continuous time linear equalizer.

12. The apparatus according to claim 1, wherein said first differential input and said second differential input comprise data signals.

13. The apparatus according to claim 1, wherein (i) said first auto-zero stage, said second auto-zero stage, said third auto-zero stage and said fourth auto-zero stage may each perform auto-zeroing, (ii) said auto-zeroing may tune idle-to-active timing and (iii) tuning said idle-to-active timing reduce idle power consumption.

14. The apparatus according to claim 13, wherein said tuning is implemented by leaving one of said first half-cell or said second half-cell in a mode of operation that performs a calibration.

15. The apparatus according to claim 1, wherein (i) said first half-cell and said second half-cell are each configured to alternate between one of (a) a signal mode of operation and (b) a calibration mode of operation, (ii) said signal mode of operation is configured to transmit data and (iii) said calibration mode of operation is configured to perform a calibration.

16. The apparatus according to claim 15, wherein said first half-cell enters said signal mode of operation for a brief amount of time before said second half-cell exits said signal mode of operation to enable continuous data transmission.

17. The apparatus according to claim 15, wherein (i) said first half-cell is configured to sample a first voltage offset between a first input signal and a reference voltage in said calibration mode of operation and (ii) said second half-cell is configured to sample a second voltage offset between a second input signal and said reference voltage in said calibration mode of operation.

18. The apparatus according to claim 17, wherein said calibration mode of operation is configured to last for an amount of time for either said first auto-zero stage or said second auto-zero stage to settle to a correct voltage level.

19. The apparatus according to claim 1, wherein (i) said first feedback buffer and said second feedback buffer each comprise a plurality of tap coefficient multiplexers and (ii) each of said tap coefficient multiplexers is connected to a feedback capacitance.

20. The apparatus according to claim 19, wherein said tap coefficient multiplexers are configured to control a combination of said feedback capacitance used to provide capacitive coupling for a summation node.

* * * * *